United States Patent [19]
Watabe

[11] Patent Number: 5,654,561
[45] Date of Patent: Aug. 5, 1997

[54] INSULATED GATE BIPOLAR TRANSISTOR WITH MULTIPLE BUFFER LAYERS

[75] Inventor: Kiyoto Watabe, Itami, Japan

[73] Assignee: Mitsubishi Denki Kabushiki Kaisha, Tokyo, Japan

[21] Appl. No.: 562,002

[22] Filed: Nov. 22, 1995

[30] Foreign Application Priority Data

Dec. 21, 1994 [JP] Japan ................................ 6-318785
May 19, 1995 [JP] Japan ................................ 7-121842

[51] Int. Cl.$^6$ ........................ H01L 29/74; H01L 31/111; H01L 27/082
[52] U.S. Cl. ........................ 257/139; 257/140; 257/145; 257/147; 257/575
[58] Field of Search ................................ 257/139–145, 257/147, 575

[56] References Cited

U.S. PATENT DOCUMENTS

| | | | |
|---|---|---|---|
| 4,618,872 | 10/1986 | Baliga | 257/140 |
| 4,782,372 | 11/1988 | Nakagawa et al. | 257/141 |
| 4,963,951 | 10/1990 | Adler et al. | 257/141 |
| 5,355,003 | 10/1994 | Tomomatsu | 257/139 |
| 5,512,774 | 4/1996 | Nakagawa et al. | 257/140 |

FOREIGN PATENT DOCUMENTS 4-320377  11/1992  Japan.
6-112494   4/1994  Japan.

OTHER PUBLICATIONS

Proc. of the 6th Internat. Symposium on Power Semiconductor Devices & IC's, pp. 399–403, May 31–Jun. 2, 1994, T. Matsudai, et al., "Thin SOI IGBT Leakage Current and a New Device Structure For High Temperature Operation".

Primary Examiner—Wael Fahmy
Assistant Examiner—Fetsum Abraham
Attorney, Agent, or Firm—Oblon, Spivak, McClelland, Maier & Neustadt, P.C.

[57] ABSTRACT

A high-concentration n-type buffer layer and a low-concentration n-type buffer layer are provided between a p-type collector layer and a high-resistance n-type base layer, and respective impurity concentrations of the low-concentration n-type buffer layer and the high-concentration n-type buffer layer are set so that concentrations of carriers that propagate through the low-concentration n-type buffer layer and the high-concentration n-type buffer layer are in excess of the respective impurity concentrations thereof in an ON state. Thus, an insulated gate bipolar transistor having excellent withstand voltage, ON-state voltage and turn-off characteristics is obtained.

14 Claims, 15 Drawing Sheets

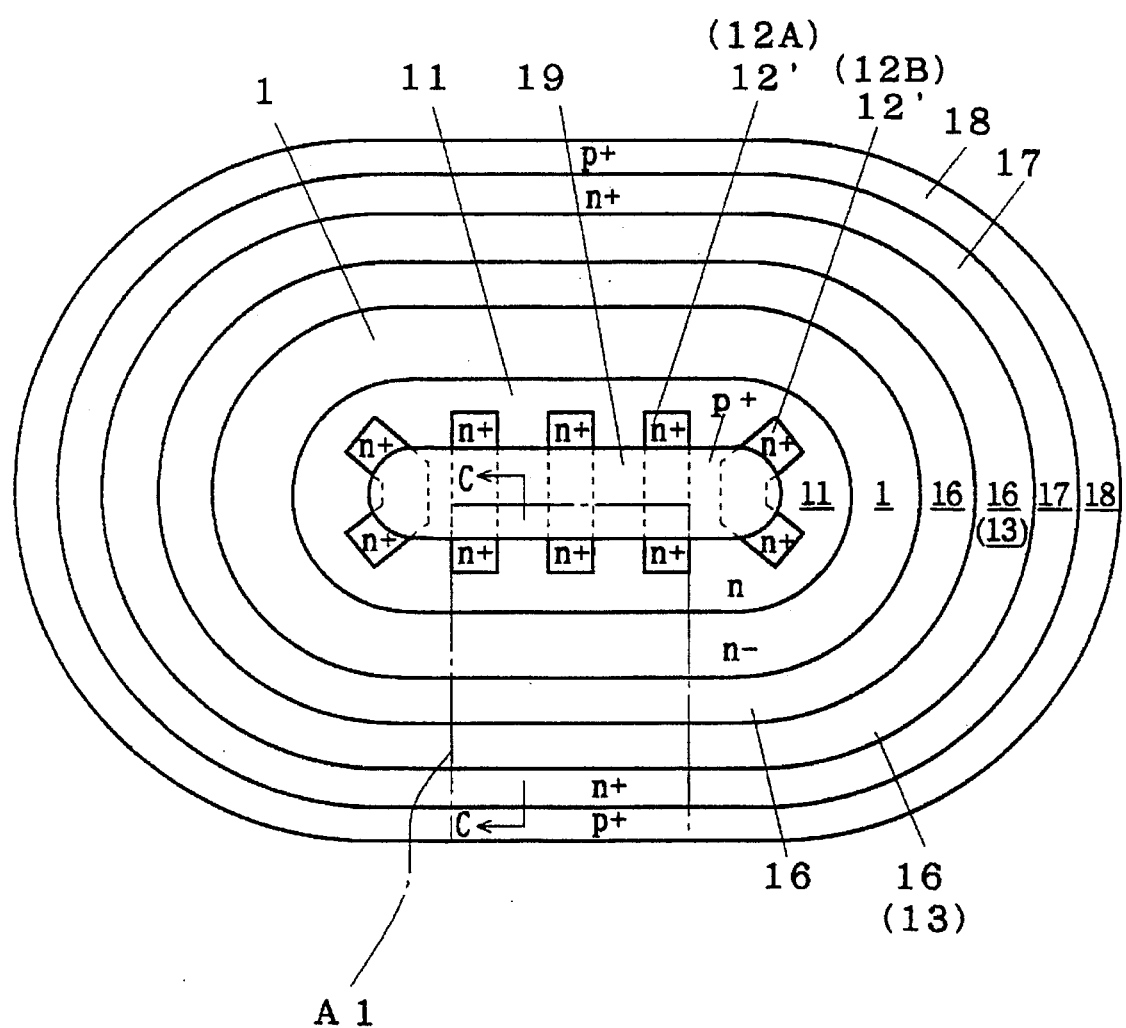
F I G. 2 5

INSULATED GATE BIPOLAR TRANSISTOR WITH MULTIPLE BUFFER LAYERS

BACKGROUND OF THE INVENTION

1. Field of the Invention

The present invention relates to an insulated gate bipolar transistor (IGBT) and a method of fabricating the same, and a semiconductor device including an IGBT and a method of fabricating the same.

2. Description of the Background Art

FIG. 17 is a sectional view showing the sectional structure of a conventional lateral IGBT. This IGBT is fabricated as follows: First, an impurity is diffused in a part of an n-type base layer 1 having a relatively low impurity concentration, to form an n-type buffer layer 2 having a relatively high impurity concentration. Then, a gate insulating film 24 and a polysilicon film 3 serving as a gate are selectively formed on the n-type base layer 1. Then, the polysilicon film 3 is employed as a mask for depositing and thereafter diffusing an impurity from the left side in the figure into an upper layer part of the n-type base layer 1, for forming a p-type base layer 4. At the same time, a p-type collector layer 19 for serving as collector is selectively formed on a surface of the n-type buffer layer 2 by diffusion. Then, an n-type emitter layer 17 for serving as an emitter is formed on a surface of the p-type base layer 4.

FIG. 19 is a plan view showing the plane structure of the conventional transversal IGBT. A section taken along the line A—A in FIG. 19 corresponds to FIG. 17. As shown in FIG. 19, the p-type base layer 4, the n-type emitter layer 17, the gate electrode 3, the n-type base layer 1, the n-type buffer layer 2 and the p-type collector layer 19 have elliptic plane shapes respectively, so that the n-type emitter layer 17 is formed inside the p-type base layer 4, and the gate electrode 3, the n-type base layer 1, the n-type buffer layer 2 and the p-type collector layer 19 are successively formed inside the n-type emitter layer 17 in a similar manner to the above.

Finally, an emitter electrode 20, a gate electrode 21 and a collector electrode 22 are formed on parts of the p-type base layer 4 and the n-type emitter layer 17, the polysilicon film 3, and the p-type collector layer 19 respectively. Thus, the lateral IGBT is formed as shown in FIG. 17. In sectional views which are hereinafter referred to, one-dot chain lines may be drawn along centers of p-type collector layers 19, to indicate that the p-type collector layers 19 are planarly positioned at the centers.

According to the conventional IGBT structure, the gate electrode 21 and the emitter electrode 20 are grounded, and the n-type buffer layer 2 suppresses spreading of a depletion layer when a positive voltage is applied to the p-type collector layer 19. When a voltage which is positive with respect to the emitter electrode 20 is applied to the gate electrode 21, an n-type channel is formed on a surface of the p-type base layer 4 under the gate 3, and electrons flow into the p-type collector layer 19 through the n-type base layer 1. At this time, holes are injected from the p-type collector layer 19, in order to satisfy a charge neutrality condition. Thus, conductivity modulation is increased and an ON-state voltage is reduced as compared with a power MOSFET.

Switching loss is generally expressed by the product of an ON-state voltage and a turn-off time. In order to reduce power consumption, therefore, desired is an IGBT having a low ON-state voltage and a short turn-off time for reducing switching loss.

An IGBT which is expected as a high withstand voltage element has an important object of improvement in withstand voltage as a matter of course, and IGBTs which are aimed at improving withstand voltages have been announced in various structures, while these IGBTs have such disadvantages that absolutely no consideration is made on ON-state voltages.

In a power IC, it is necessary to form a low withstand voltage element such as a CMOS element for forming a logic circuit on the same substrate as a high withstand voltage element such as an IGBT. FIG. 18 is a sectional view showing the sectional structure of an n-channel MOSFET. First, a p-type well diffusion layer 7 is formed in the same n-type base layer 1 as a high withstand voltage element. A gate insulating film 23 and a polysilicon film 8 serving as a gate are selectively formed on a surface of the p-type well diffusion layer 7. Then, the polysilicon film 8 is employed as a mask to form n-type diffusion layers 9 and 10 of relatively high concentrations for serving as source and drains on both sides of the polysilicon film 8 on the surface of the p-type well diffusion layer 7. Then, a drain electrode 64, a source electrode, and a gate 66 are formed on the n-type diffusion layer 9, the n-type diffusion layer 10, and the polysilicon film 8 respectively. Thus, a low withstand voltage MOSFET shown in FIG. 18 is formed.

In the aforementioned fabrication steps of the high withstand voltage element (IGBT) and the low withstand voltage element (MOSFET), both the p-type base layer 4 of the high withstand voltage element and the p-type well diffusion layer 7 of the low withstand voltage element are diffusion layers for forming channel parts. However, these must be formed through separate steps, for the following reason:

The p-type base layer 4 for serving as a p-type channel part of the high withstand voltage element is formed by diffusing an impurity after deposition from the left side of a position A through the polysilicon film 3 serving as a mask, and hence the p-type channel part provided under the polysilicon film 3 is formed by transversal diffusion. Namely, there is such a tendency that the impurity concentration is rightwardly reduced from the position A.

On the other hand, the p-type well diffusion layer 7 for serving as a p-type channel part of the low withstand voltage element is formed before formation of the polysilicon film 8, and hence the same is formed by longitudinal diffusion from the surface of the n-type base layer 1, whereby a uniform impurity concentration can be attained in the transversal direction.

Thus, there is an essential difference between the methods of forming the channel parts in the high withstand voltage element and the low withstand voltage element, and hence the implanation doses of the impurities are different from each other in the p-type base layer 4 and the p-type well diffusion layer 7. Further, the p-type channel part of the high withstand voltage element utilizes transversal diffusion of the p-type base layer 4 as described above, whereby a channel length L is inevitably decided by the depth of the diffusion. Thus, it is necessary to design the depth of the diffusion in the high withstand voltage element independently of the low withstand voltage element.

Thus, the fabrication steps for the conventional IGBT which is employed for a power IC are independent of those for the field effect transistor which is a simultaneously integrated low withstand voltage element, and the fabrication steps are inevitably complicated in order to integrate both on one chip.

SUMMARY OF THE INVENTION

According to a first aspect of the present invention, an insulated gate bipolar transistor comprises a first conductivity type first semiconductor layer, a second conductivity type second semiconductor layer which is selectively formed in an upper layer part of the first semiconductor layer, a first conductivity type third semiconductor layer which is selectively formed on a surface of the second semiconductor layer, an insulating film which is formed on the second semiconductor layer between the first and third semiconductor layers, a control electrode part which is formed on the insulating film, a first conductivity type fourth semiconductor layer which is selectively formed in the first semiconductor layer independently of the second semiconductor layer, and a second conductivity type fifth semiconductor layer which is selectively formed on a surface of the fourth semiconductor layer, while the fourth semiconductor layer is provided with first conductivity type first to n-th ($n \geq 2$) buffer layers which are formed over the first and fifth semiconductor layers to be adjacent to each other, the fifth semiconductor layer is formed on a surface of the n-th buffer layer, and the first to n-th buffer layers satisfy both of a conditional expression 1: $B1<B2<\ldots<Bn$ and a conditional expression 2: $Bi<Ci$ ($1 \leq i \leq n$) assuming that B1 to Bn represent first conductivity type impurity concentrations of the first to n-th buffer layers respectively, and C1 to Cn represent concentrations of carriers which are propagated through the first to n-th buffer layers in an ON state of applying a prescribed voltage to the control electrode part and feeding a current across the third and fifth semiconductor layers while setting a prescribed potential difference therebetween.

Preferably, n=2, the impurity concentration B1 of the first buffer layer is $3.4 \times 10^{16}$ cm$^{-3}$, and the impurity concentration B2 of the second buffer layer is $1.16 \times 10^{17}$ cm$^{-3}$.

Preferably, the first conductivity type is an n-type, and the second conductivity type is a p-type.

In an insulated gate bipolar transistor according to a second aspect of the present invention, the impurity concentrations B1 to Bn of the first to n-th buffer layers may be set in the range of $3.4 \times 10^{16}$ to $8.0 \times 10^{17}$ cm$^{-3}$ respectively.

In an insulated gate bipolar transistor according to a third aspect of the present invention, the fourth semiconductor layer may be formed to pass through a surface and aback surface of the first semiconductor layer.

Preferably, n=2, and no first buffer is formed under the fifth semiconductor layer.

According to a fourth aspect of the present invention, an insulated gate bipolar transistor comprises a first conductivity type first semiconductor layer, a second conductivity type second semiconductor layer which is selectively formed in an upper layer part of the first semiconductor layer, a first conductivity type third semiconductor layer which is selectively formed on a surface of the second semiconductor layer, an insulating film which is formed on the second semiconductor layer between the first and third semiconductor layers, a control electrode part which is formed on the insulating film, a first conductivity type fourth semiconductor layer which is selectively formed in the first semiconductor layer independently of the second semiconductor layer, and a second conductivity type fifth semiconductor layer which is selectively formed on a surface of the fourth semiconductor layer, while the fourth semiconductor layer has first conductivity type first and second buffer layers which are formed over the first and fifth semiconductor layers, the second buffer layer is higher in impurity concentration than the first buffer layer and selectively formed on a surface of the first buffer layer, and the fifth semiconductor layer is formed on surfaces of the first and second buffer layers.

Preferably, the second buffer layer is discretely formed on the surface of the first buffer layer.

Preferably, the second buffer layer is present under a central portion of the fifth semiconductor layer.

According to a fifth aspect of the present invention, an insulated gate bipolar transistor comprises a first conductivity type first semiconductor layer, a second conductivity type second semiconductor layer which is selectively formed in an upper layer part of the first semiconductor layer, a first conductivity type third semiconductor layer which is selectively formed on a surface of the second semiconductor layer, an insulating film which is formed on the second semiconductor layer between the first and third semiconductor layers, a control electrode part which is formed on the insulating film, a first conductivity type fourth semiconductor layer which is selectively formed in the first semiconductor layer independently of the second semiconductor layer, and a second conductivity type fifth semiconductor layer which is selectively formed on a surface of the fourth semiconductor layer, while the fourth semiconductor layer has first conductivity type first and second buffer layers which are formed over the first and fifth semiconductor layers, the second buffer layer is higher in impurity concentration than the first buffer layer and selectively formed on a surface of the first buffer layer, and the fifth semiconductor layer is formed only on the surface of the first buffer layer and separated from the second buffer layer at a prescribed distance.

Preferably, the second buffer layer is discretely formed on the surface of the first buffer layer.

According to a sixth aspect of the present invention, a semiconductor device comprises the insulated gate bipolar transistor according to the first aspect, and a field effect transistor which is formed in the first semiconductor layer independently of the insulated gate bipolar transistor, and the field effect transistor comprises a second conductivity type well region which is formed in the upper layer part of the first semiconductor layer, first conductivity type first and second diffusion regions which are selectively formed on a surface of the well region, a second insulating film which is formed on the well region between the first and second diffusion regions, and a second control electrode part which is formed on the second insulating film, while the well region is set at the same impurity concentration as the second semiconductor layer of the insulated gate bipolar transistor.

According to a seventh aspect of the present invention, a semiconductor device comprises the insulated gate bipolar transistor according to the first aspect, and a field effect transistor which is formed in the first semiconductor layer independently of the insulated gate bipolar transistor, and the field effect transistor comprises a first conductivity type well region which is formed in the upper layer part of the first semiconductor layer, second conductivity type first and second diffusion regions which are selectively formed on a surface of the well region, a second insulating film which is formed on the well region between the first and second diffusion regions, and a second control electrode part which is formed on the second insulating film, while the impurity concentration of the well region is set at any one of values SB1 to $SB_n$, assuming that SBk (k=2 to n)=Bk−B(k−1) and SB1=B1 in the respective impurity concentrations B1 to Bn of the first to n-th buffer layers of the insulated gate bipolar transistor.

According to an eighth aspect of the present invention, a semiconductor device comprises the insulated gate bipolar transistor according to the first aspect, and first and second field effect transistors which are formed in the first semiconductor layer independently of the insulated gate bipolar transistor, and the first field effect transistor comprises a second conductivity type first well region which is formed in the upper layer part of the first semiconductor layer, first conductivity type first and second diffusion regions which are selectively formed on a surface of the first well region, a second insulating film which is formed on the first well region between the first and second diffusion regions, and a second control electrode part which is formed on the second insulating film, while the second field effect transistor comprises the first semiconductor layer, a first conductivity type second well region which is formed in the upper layer part of the first semiconductor layer independently of the first well region, second conductivity type third and fourth diffusion regions which are selectively formed on a surface of the second well region, a third insulating film which is formed on the second well region between the third and fourth diffusion regions, and a third control electrode part which is formed on the second insulating film, the first well region is set at the same impurity concentration as the second semiconductor layer of the insulated gate bipolar transistor, and the impurity concentration of the second well region is set at any one of values SB1 to SBn, assuming that SBk (k=2 to n)=Bk−B(k−1) and SB1=B1 in the respective impurity concentrations B1 to Bn of the first to n-th buffer layers of the insulated gate bipolar transistor.

According to a ninth aspect of the present invention, a method of fabricating an insulated gate bipolar transistor comprises the steps of (a) preparing a first conductivity type first semiconductor layer, (b) selectively forming a second conductivity type second semiconductor layer in an upper layer part of the first semiconductor layer, (c) selectively forming a first conductivity type third semiconductor layer on a surface of the second semiconductor layer, (d) forming an insulating film on the second semiconductor layer between the first and third semiconductor layers, (e) forming a control electrode part on the insulating film, (f) selectively forming a first conductivity type fourth semiconductor layer in the first semiconductor layer independently of the second semiconductor layer, and (g) selectively forming a second conductivity type fifth semiconductor layer on a surface of an n-th buffer layer of the fourth semiconductor layer, the step (f) is adapted to form first to n-th ($n \geq 2$) buffer layers which are adjacent to each other as the fourth semiconductor layer over the first to fifth semiconductor layers by successively carrying out first to n-th impurity introducing processings for selectively introducing a first conductivity type impurity, and both of a conditional expression 1: $B1<B2<\ldots<Bn$ and a conditional expression 2: $Bi<Ci$ ($1 \leq i \leq n$) are satisfied assuming that B1 to Bn represent first conductivity type impurity concentrations of the first to n-th buffer layers respectively, and C1 to Cn represent concentrations of carriers which are propagated through the first to n-th buffer layers respectively in an ON state of applying a prescribed voltage to the control electrode part and feeding a current across the third and fifth semiconductor layers while setting a prescribed potential difference therebetween.

Preferably, n=2, an impurity concentration which is set by the first impurity introduction processing is $3.4 \times 10^{16}$ cm$^{-3}$, and an impurity concentration which is set by the second impurity introduction processing is $8.2 \times 10^{16}$ cm$^{-3}$.

Preferably, the first conductivity type is an n-type, and the second conductivity type is a p-type.

According to a tenth aspect of the present invention, a method of fabricating a semiconductor device is a method of forming an insulated gate bipolar transistor and a field effect transistor on the same substrate, and comprises the steps of (a) preparing a first conductivity type first semiconductor layer serving as the substrate, (b) selectively forming a second conductivity type second semiconductor layer in an upper layer part of the first semiconductor layer, (c) selectively forming a first conductivity type third semiconductor layer on a surface of the second semiconductor layer, (d) forming a first insulating film on the second semiconductor layer between the first and third semiconductor layers, (e) forming a first control electrode part on the first insulating film, (f) selectively forming a first conductivity type fourth semiconductor layer in the first semiconductor layer independently of the second semiconductor layer, and (g) selectively forming a second conductivity type fifth semiconductor layer on a surface of an n-th buffer layer of the fourth semiconductor layer, the step (f) is adapted to form first to n-th ($n \geq 2$) buffer layers which are adjacent to each other as the fourth semiconductor layer over the first to fifth semiconductor layers by successively carrying out first to n-th impurity introducing processings for selectively introducing a first conductivity type impurity, the insulated gate bipolar transistor is fabricated through the steps (a) to (g), both of a conditional expression 1: $B1<B2<\ldots<Bn$ and a conditional expression 2: $Bi<Ci$ ($1 \leq i \leq n$) are satisfied assuming that B1 to Bn represent first conductivity type impurity concentrations of the first to n-th buffer layers respectively, and C1 to Cn represent concentrations of carriers which are propagated through the first to n-th buffer layers respectively in an ON state of applying a prescribed voltage to the control electrode part and feeding a current across the third and fifth semiconductor layers while setting a prescribed potential difference therebetween, the method further comprises the steps of (h) forming a second conductivity type well region in the upper layer part of the first semiconductor layer, (i) selectively forming first conductivity type first and second diffusion regions on a surface of the well region, (j) forming a second insulating film on the well region between the first and second diffusion regions, and (k) forming a second control electrode part on the second insulating film, and the field effect transistor is fabricated through the steps (h) to (k), and second conductivity type impurity concentration introducing conditions in the steps (b) and (h) are made identical to each other.

According to an eleventh aspect of the present invention, a method of fabricating a semiconductor device is a method of forming an insulated gate bipolar transistor and a field effect transistor on the same substrate, and comprises the steps of (a) preparing a first conductivity type first semiconductor layer serving as the substrate, (b) selectively forming a second conductivity type second semiconductor layer in an upper layer part of the first semiconductor layer, (c) selectively forming a first conductivity type third semiconductor layer on a surface of the second semiconductor layer, (d) forming a first insulating film on the second semiconductor layer between the first and third semiconductor layers, (e) forming a first control electrode part on the first insulating film, (f) selectively forming a first conductivity type fourth semiconductor layer in the first semiconductor layer independently of the second semiconductor layer, and (g) selectively forming a second conductivity type fifth semiconductor layer on a surface of an n-th buffer layer of the fourth semiconductor layer, the step (f) is adapted to form first to n-th ($n \geq 2$) buffer layers which are adjacent to each other as the fourth semiconductor layer over the first to fifth semiconductor layers by successively carrying out first to n-th impurity introducing processings for selectively introducing a first conductivity type impurity, the impurity concentration of the i-th ($1 \leq i \leq n$) buffer layer is decided by first to i-th impurity introducing processings, the insulated gate bipolar transistor is fabricated through the steps (a) to (g), both of a conditional expression 1: $B1<B2<\ldots<Bn$ and a conditional expression 2: $Bi<Ci$ ($1 \leq i \leq n$) are satisfied assuming that B1 to Bn represent first conductivity type impurity concentrations of the first to n-th buffer layers respectively, and C1 to Cn represent concentrations of carriers which are propagated through the first to n-th buffer layers respectively in an ON state of applying a prescribed voltage to the control electrode part and feeding a current across the third and fifth semiconductor layers while setting a prescribed potential difference therebetween, the method of fabricating a semiconductor device further comprises the steps of (h) forming a first conductivity type well region in the upper layer part of the first semiconductor layer, (i) selectively forming second conductivity type first and second diffusion regions on a surface of the well region, (j) forming a second insulating film on the well region between the first and second diffusion regions, and (k) forming a second control electrode part on the second insulating film, the field effect transistor is fabricated through the steps (h) to (k), and first conductivity type impurity concentration introducing conditions in any one of the first to n-th impurity introducing processings of the step (f) and the impurity introducing processing in the (h) are made identical to each other.

According to a twelfth aspect of the present invention, a method of fabricating a semiconductor device is a method of forming an insulated gate bipolar transistor and first and second field effect transistors on the same substrate, and comprises the steps of (a) preparing a first conductivity type first semiconductor layer serving as the substrate, (b) selectively forming a second conductivity type second semiconductor layer in an upper layer part of the first semiconductor layer, (c) selectively forming a first conductivity type third semiconductor layer on a surface of the second semiconductor layer, (d) forming a first insulating film on the second semiconductor layer between the first and third semiconductor layers, (e) forming a first control electrode part on the first insulating film, (f) selectively forming a fourth semiconductor layer in the first semiconductor layer independently of the second semiconductor layer, and (g) selectively forming a second conductivity type fifth semiconductor layer on a surface of an n-th buffer layer of the fourth semiconductor layer, the step (f) is adapted to form first to n-th ($n \geq 2$) buffer layers which are adjacent to each other over the first to fifth semiconductor layers by successively carrying out first to n-th impurity introducing processings for selectively introducing a first conductivity type impurity, the impurity concentration of the i-th ($1 \leq i \leq n$) buffer layer is decided by first to i-th impurity introducing processings, the insulated gate bipolar transistor is fabricated through the steps (a) to (g), both of a conditional expression 1: $B1<B2<\ldots<Bn$ and a conditional expression 2: $Bi<Ci$ ($1 \leq i \leq n$) are satisfied assuming that B1 to Bn represent first conductivity type impurity concentrations of the first to n-th buffer layers respectively, and C1 to Cn represent concentrations of carriers are propagated through the first to n-th buffer layers respectively in an ON state of applying a prescribed voltage to the control electrode part and feeding a current across the third and fifth semiconductor layers while setting a prescribed potential difference therebetween, the method further comprises the steps of (h) forming a second conductivity type first well region in the upper layer part of the first semiconductor layer, (i) selectively forming first conductivity type first and second diffusion regions on a surface of the first well region, (j) forming a second insulating film on the first well region between the first and second diffusion regions, and (k) forming a second control electrode part on the second insulating film, the first field effect transistor is fabricated through the steps (h) to (k), the method further comprises the steps of (l) forming a first conductivity type second well region in the upper layer part of the first semiconductor layer, (m) selectively forming second conductivity type third and fourth diffusion regions on a surface of the second well region, (n) forming a third insulating film on the second well region between the third and fourth diffusion regions, and (o) forming a third control electrode part on the third insulating film, the second field effect transistor is fabricated through the steps (l) to (o), second conductivity type impurity concentration introducing conditions in the steps (b) and (h) are made identical to each other, and first conductivity type impurity concentration introducing conditions in any one of the first to n-th impurity introducing processings of the step (f) and the impurity introducing processing in the (h) are made identical to each other.

The first to n-th buffer layers of the insulated gate bipolar transistor according to the first aspect of the present invention satisfy both of the conditional expression 1: $B1<B2<\ldots<Bn$ and the conditional expression 2: $Bi<Ci$ ($1 \leq i \leq n$) assuming that B1 to Bn represent first conductivity type impurity concentrations of the first to n-th buffer layers respectively, and C1 to Cn represent concentrations of carriers which are propagated through the first to n-th buffer layers respectively in an ON state of applying a prescribed voltage to the control electrode part and feeding a current across the third and fifth semiconductor layers while setting a prescribed potential difference therebetween.

An excellent ON-state voltage can be attained in an ON state since the first to n-th buffer layers satisfy the conditional expression 2, while improvement of the withstand voltage can be attained since the first to n-th buffer layers satisfy the conditional expression 1.

The insulated gate bipolar transistor according to the second aspect sets the impurity concentrations B1 to Bn of the first to n-th buffer layers in the range of $3.4 \times 10^{16}$ to $8.0 \times 10^{17}$ cm$^{-3}$ to satisfy the conditional expressions 1 and 2, thereby implementing excellent ON-state voltage, withstand voltage and turn-off characteristics in an actual operation level.

In the insulated gate bipolar transistor according to the third aspect, the fourth semiconductor layer consisting of the first to n-th buffer layers is formed to pass through the surface and the back surface of the first semiconductor layer, whereby the thickness of the first semiconductor layer can be relatively reduced.

The fifth semiconductor layer of the insulated gate bipolar transistor according to the fourth aspect of the present invention is formed on the surfaces of the first and second buffer layers, whereby the same is partially directly connected also with the first buffer layer whose impurity concentration is lower than that of the second buffer layer.

Therefore, carrier injection is caused at an ON start time from the fifth semiconductor layer through the first buffer layer having a relatively low concentration, whereby the carrier concentration can be successively increased.

The fifth semiconductor layer of the insulated gate bipolar transistor according to the fifth aspect of the present invention is formed on the surface of the first buffer layer, whereby the first buffer layer whose impurity concentration is lower than that of the second buffer layer and the fifth semiconductor layer are necessarily electrically connected with each other.

Therefore, carrier injection is caused at an ON start time from the fifth semiconductor layer through the first buffer layer having a relatively low concentration, whereby the carrier concentration can be successively increased.

In the semiconductor device according to the sixth aspect of the present invention, the second conductivity type well region of the field effect transistor is set at the same impurity concentration as the second conductivity type second semiconductor layer of the insulated gate bipolar transistor, whereby the well region and the second semiconductor layer can be fabricated in the same step.

The semiconductor device according to the seventh aspect of the present invention sets the impurity concentration of the well region of the field effect transistor at any one of the values SB1 to SBn, assuming that SBk (k=2 to n)=Bk−B (k−1) and SB1=B1 in the respective impurity concentrations B1 to Bn of the first to n-th buffer layers of the insulated gate bipolar transistor.

In order to satisfy the conditional expression 1: B1<B2< ... <Bn, the first to n-th buffer layers are fabricated by multiple diffusion by the first to n-th impurity introducing processings. Namely, the impurity concentration of the i-th (1≦i≦n) buffer layer is set by multiple diffusion by the first to i-th impurity introducing processings. At this time, impurity concentrations which are set by the first to n-th impurity introducing processings respectively are SB1 to SBn.

The semiconductor device according to the eighth aspect of the present invention sets the first well region of the first field effect transistor at the same impurity concentration as the second semiconductor layer, while setting the impurity concentration of the second well region of the second field effect transistor at any one of the aforementioned values SB1 to SBn.

Therefore, it is possible to fabricate the first well region of the first field effect transistor and the second semiconductor layer of the insulated gate bipolar transistor in the same step, while the fabrication processing for the second well region of the second field effect transistor and any one of the first to n-th impurity introducing processings can be performed in the same step when the first to n-th buffer layers are fabricated by multiple diffusion by the first to n-th impurity introducing processings in order to satisfy the conditional expression 1: B1<V2<< ... <Bn.

The first to n-th buffer layers of the insulated gate bipolar transistor fabricated by the method according to the ninth aspect of the present invention satisfies both of the conditional expression 1: B1<B2< ... <Bn and the conditional expression 2: Bi<Ci (1≦i≦n) assuming that B1 to Bn represent first conductivity type impurity concentrations of the first to n-th buffer layers respectively, and C1 to Cn represent concentrations of carriers which are propagated through the first to n-th buffer layers respectively in an ON state of applying a prescribed voltage to the control electrode part and feeding a current across the third and fifth semiconductor layers while setting a prescribed potential difference therebetween.

An excellent ON-state voltage can be attained in an ON state since the first to n-th buffer layers satisfy the conditional expression 2, while improvement of the withstand voltage can be attained since the first to n-th buffer layers satisfy the conditional expression 1.

In the method of fabricating a semiconductor device according to the tenth aspect of the present invention, the step (b) in the steps of fabricating the insulated gate bipolar transistor and the step (h) in the steps of fabricating the field effect transistor are carried out under the same impurity concentration introducing conditions, whereby the steps (b) and (h) can be simultaneously executed.

In the method of fabricating a semiconductor device according to the eleventh aspect of the present invention, any one of the first to n-th impurity introducing processings of the step (f) in the steps of fabricating the insulated gate bipolar transistor and the impurity introducing processing in the step (h) in the steps of fabricating the field effect transistor are carried out under the same impurity concentration introducing conditions, whereby any one of the first to n-th impurity introducing processings and the step (h) can be simultaneously executed.

In the method of fabricating a semiconductor device according to the twelfth aspect of the present invention, the step (b) in the steps of fabricating the insulated gate bipolar transistor and the step (h) in the steps of fabricating the first field effect transistor are carried out under the same impurity concentration introducing conditions, whereby the steps (b) and (h) can be simultaneously executed.

Further, any one of the first to n-th impurity introducing processings of the step (f) in the steps of fabricating the insulated gate bipolar transistor and the impurity introducing processing of the step (l) in the steps of fabricating the second field effect transistor are carried out under the same impurity concentration introducing conditions, whereby any one of the first to n-th impurity introducing processings and the step (l) can be simultaneously executed.

As hereinabove described, the first to n-th buffer layers of the insulated gate bipolar transistor according to the first aspect of the present invention satisfy both of the conditional expression 1: B1<B2< ... <Bn and the conditional expression 2: Bi<Ci (1≦i≦n) assuming that B1 to Bn represent first conductivity type impurity concentrations of the first to n-th buffer layers respectively, and C1 to Cn represent concentrations of carriers which are propagated through the first to n-th buffer layers respectively in an ON state of applying a prescribed voltage to the control electrode part, setting a prescribed potential difference between the third and fifth semiconductor layers and feeding a current across the third and fifth semiconductor layers.

An excellent ON-state voltage can be attained in an ON state since the first to n-th buffer layers satisfy the conditional expression 2, while improvement of the withstand voltage can be attained since the first to n-th buffer layers satisfy the conditional expression 1.

Consequently, the insulated gate bipolar transistor according to the first aspect attains an excellent ON-state voltage by satisfying the conditional expression 2, and can attain excellent withstand voltage and turn-off characteristics by sufficiently largely setting the impurity concentrations B1 to Bn of the first to n-th buffer layers in a range satisfying the conditional expressions 1 and 2.

The insulated gate bipolar transistor according to the second aspect sets the impurity concentrations B1 to B2 of the first to n-th buffer layers in the range of $3.4 \times 10^{16}$ to $8.0 \times 10^{17}$ cm$^{-3}$ to satisfy the conditional expressions 1 and 2, thereby implementing excellent ON-state voltage, withstand voltage and turn-off characteristics in an actual operation level.

In the insulated gate bipolar transistor according to the third aspect, the fourth semiconductor layer consisting of the first to n-th buffer layers is formed to pass through the surface and the back surface of the first semiconductor layer, whereby the thickness of the first semiconductor layer can be relatively reduced.

Consequently, it is possible to obtain an insulated gate bipolar transistor having further excellent turn-off characteristics by forming the first semiconductor layer in a small thickness.

The fifth semiconductor layer of the insulated gate bipolar transistor according to the fourth aspect of the present invention is formed on the surfaces of the first and second buffer layers, whereby the same is partially directly connected also with the first buffer layer whose impurity concentration is lower than that of the second buffer layer.

Therefore, carrier injection is caused at an ON start time from the fifth semiconductor layer through the first buffer layer having a relatively low concentration, whereby the carrier concentration can be successively increased.

Consequently, it is possible to sufficiently highly set the impurity concentration of the second buffer layer which must be set below the carrier concentration in a stationary state in order to prevent increase of the ON-state voltage, whereby the withstand voltage and the turn-off ability can be improved without increasing the ON-state voltage.

The fifth semiconductor layer of the insulated gate bipolar transistor according to the fifth aspect of the present invention is formed on the surface of the first buffer layer, whereby the first buffer layer whose impurity concentration is lower than that of the second buffer layer and the fifth semiconductor layer are necessarily electrically connected with each other.

Therefore, carrier injection is caused at an ON start time from the fifth semiconductor layer through the first buffer layer having a relatively low concentration, whereby the carrier concentration can be successively increased.

Consequently, it is possible to sufficiently highly set the impurity concentration of the second buffer layer which must be set below the carrier concentration in a stationary state in order to prevent increase of the ON-state voltage, whereby the withstand voltage and the turn-off ability can be improved without increasing the ON-state voltage.

In particular, the fifth semiconductor layer is formed only on the surface of the first buffer layer so that a wide connection region can be attained between the fifth semiconductor layer and the first buffer layer, whereby it is possible to further highly set the impurity concentration of the second buffer layer which must be set below the carrier concentration in a stationary state in order to prevent increase of the ON-state voltage.

In the semiconductor device according to the sixth aspect of the present invention, the second conductivity type well region of the field effect transistor is set at the same impurity concentration as the second conductivity type second semiconductor layer of the insulated gate bipolar transistor, whereby the well region and the second semiconductor layer can be fabricated in the same step.

Consequently, the fabrication steps can be shortened since the well region and the second semiconductor layer can be fabricated in the same step.

The semiconductor device according to the seventh aspect of the present invention sets the impurity concentration of the well region of the field effect transistor at any one of values $SB1$ to $SBn$, assuming that $SBk$ ($k=2$ to $n$)$=Bk-B$ ($k-1$) and $SB1=B1$ in the respective impurity concentrations $B1$ to $Bn$ of the first to n-th buffer layers of the insulated gate bipolar transistor.

In order to satisfy the conditional expression 1: $B1<B2< \ldots <Bn$, the first to n-th buffer layers are fabricated by multiple diffusion by the first to n-th impurity introducing processings. Namely, the impurity concentration of the i-th ($1 \leq i \leq n$) buffer layer is set by multiple diffusion by the first to i-th impurity introducing processings. At this time, impurity concentrations which are set by the first to n-th impurity introducing processings respectively are $SB1$ to $SBn$.

Consequently, the fabrication steps can be shortened since fabrication of the well region and any one of the first to n-th impurity introducing processings can be performed in the same step.

The semiconductor device according to the eighth aspect of the present invention sets the first well region of the first field effect transistor at the same impurity concentration as the second semiconductor layer, while setting the impurity concentration of the second well region of the second field effect transistor at any one of the aforementioned values $SB1$ to $SBn$.

Therefore, it is possible to fabricate the first well region of the first field effect transistor and the second semiconductor layer of the insulated gate bipolar transistor in the same step, while the fabrication processing for the second well region of the second field effect transistor and any of the first to n-th impurity introducing processings can be performed in the same step when the first to n-th buffer layers are fabricated by multiple diffusion by the first to n-th impurity introducing processings in order to satisfy the conditional expression 1: $B1<V2<< \ldots <Bn$.

Consequently, the fabrication steps can be shortened since the first well region of the first field effect transistor and the second semiconductor layer of the insulated gate bipolar transistor can be fabricated in the same step and fabrication of the second well region of the second field effect transistor and any one of the first to n-th impurity introducing processings can be performed in the same step.

The first to n-th buffer layers of the insulated gate bipolar transistor fabricated by the method according to the ninth aspect of the present invention satisfies both of the conditional expression 1: $B1<B2< \ldots <Bn$ and the conditional expression 2: $Bi<Ci$ ($1 \leq i \leq n$) assuming that $B1$ to $Bn$ represent first conductivity type impurity concentrations of respective ones of the first to n-th buffer layers, and $C1$ to $Cn$ represent concentrations of carriers which are propagated through the first to n-th buffer layers respectively in an ON state of applying a prescribed voltage to the control electrode part, setting a prescribed potential difference between the third and fifth semiconductor layers and feeding a current across the third and fifth semiconductor layers.

An excellent ON-state voltage can be attained in an ON state since the first to n-th buffer layers satisfy the conditional expression 2, while improvement of the withstand voltage can be attained since the first to n-th buffer layers satisfy the conditional expression 1.

Consequently, the insulated gate bipolar transistor fabricated by the method according to the ninth aspect obtains an excellent ON-state voltage by satisfying the conditional expression 2, and can attain excellent withstand voltage and turn-off characteristics by sufficiently largely setting the impurity concentrations $B1$ to $Bn$ of the first to n-th buffer layers in a range satisfying the conditional expressions 1 and 2.

In the method of fabricating a semiconductor device according to the tenth aspect of the present invention, the step (b) in the steps of fabricating the insulated gate bipolar transistor and the step (h) in the steps of fabricating the field effect transistor are carried out under the same impurity concentration introducing conditions, whereby the steps (b) and (h) can be simultaneously executed.

Consequently, the fabrication steps can be shortened since the steps (b) and (h) are performed at the same time.

In the method of fabricating a semiconductor device according to the eleventh aspect of the present invention, any one of the first to n-th impurity introducing processings of the step (f) in the steps of fabricating the insulated gate bipolar transistor and the impurity introducing processing of the step (h) in the steps of fabricating the field effect transistor are carried out under the same impurity concentration introducing conditions, whereby any one of the first to n-th impurity introducing processings and the step (h) can be simultaneously executed.

Consequently, the fabrication steps can be shortened since any one of the first to n-th impurity introducing processings and the step (h) are performed at the same time.

In the method of fabricating a semiconductor device according to the twelfth aspect of the present invention, the step (b) in the steps of fabricating the insulated gate bipolar transistor and the step (h) in the steps of fabricating the field effect transistor are carried out under the same impurity concentration introducing conditions, whereby the steps (b) and (h) can be simultaneously executed.

Further, any one of the first to n-th impurity introducing processings of the step (f) in the steps of fabricating the insulated gate bipolar transistor and the impurity introducing processing of the step (l) in the steps of fabricating the second field effect transistor are carried out under the same impurity concentration introducing conditions, whereby any one of the first to n-th impurity introducing processings and the step (l) can be simultaneously executed.

Consequently, the fabrication steps can be shortened since the steps (b) and (h) are simultaneously executed and any one of the first to n-th impurity introducing processings and the step (h) are simultaneously executed.

Accordingly, an object of the present invention is to obtain an insulated gate bipolar transistor which is improved in withstand voltage, reduced in ON-state voltage and reduced in turn-off time to have excellent withstand voltage, ON-state voltage and turn-off characteristics and a method of fabricating the same, as well as a semiconductor device consisting of the aforementioned insulated gate bipolar transistor and a field effect transistor and a method of fabricating the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a plan view showing the plane structure of the lateral IGBT according to the first mode of the fifth embodiment;

DESCRIPTION OF THE PREFERRED EMBODIMENTS

<<First Embodiment>>
<Structure>

Figure 1:
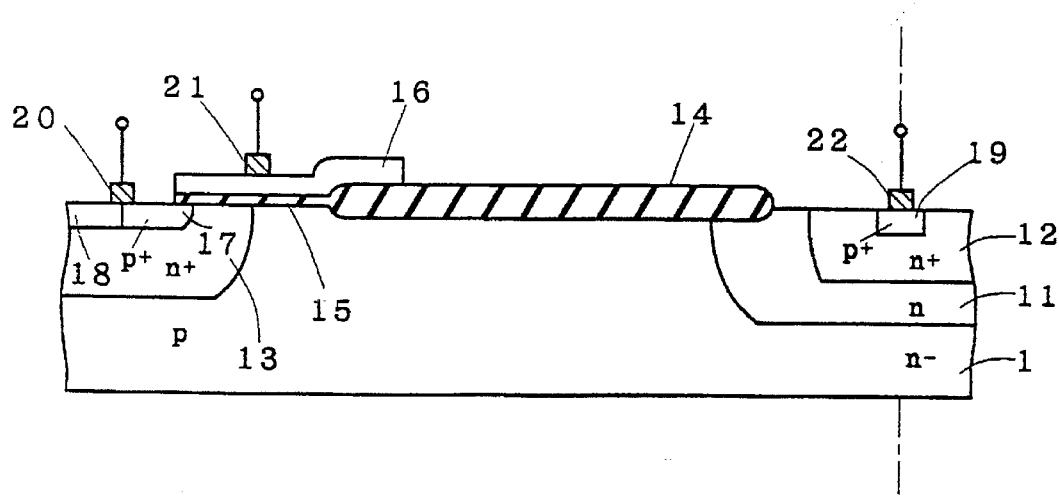
FIG 1 is a sectional view showing the structure of a lateral IGBT according to a first embodiment of the present invention.

FIG. 1 is a sectional view showing the sectional structure of a lateral IGBT according to a first embodiment of the present invention. As shown in FIG. 1, a p-type base layer 13 is selectively formed in an upper layer part of a high-resistance n-type base layer 1, an n-type emitter layer 17 and a high-concentration p-type layer 18 are formed on a surface of the p-type base layer 13 to be adjacent to each other, a low-concentration n-type buffer layer 11 is formed in the upper layer part of the n-type base layer 1 independently of the p-type base layer 13, a high-concentration n-type buffer layer 12 is selectively formed in an upper layer part of the low-concentration n-type buffer layer 11, and a p-type collector layer 19 is selectively formed on a surface of the high-concentration n-type buffer layer 12. Namely, the high-concentration buffer layer 12 and the low-concentration n-type buffer layer 11 are provided between the p-type collector layer 19 and the high-resistance n-type base layer 1. Impurity concentrations of the low-concentration n-type buffer layer 11 and the high-concentration n-type buffer layer 12 satisfy conditional expressions 1 and 2 described later.

Figure 20:
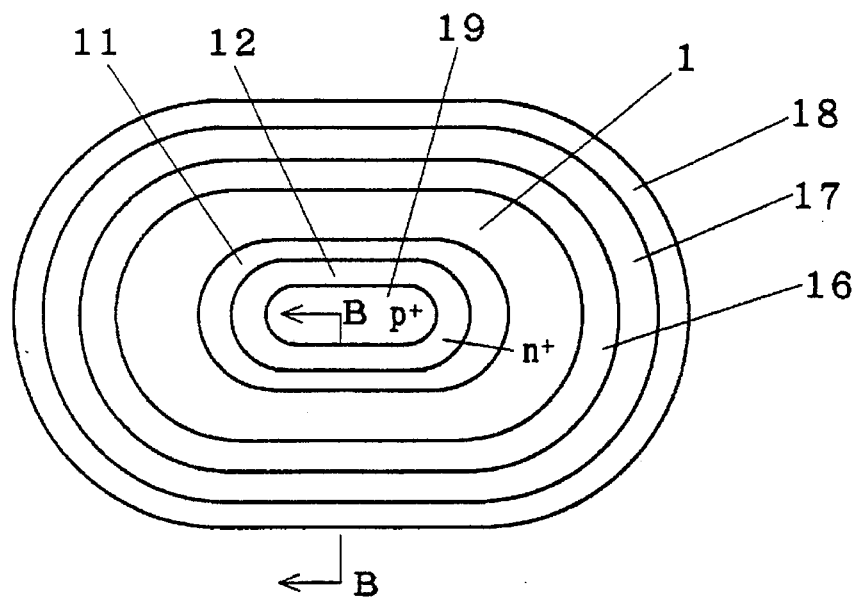
FIG. 20 is a plan view showing the plane structure of the lateral IGBT according to the first embodiment.

FIG. 20 is a plan view showing the plane structure of the lateral IGBT according to the first embodiment. A section taken along the line B—B in FIG. 20 corresponds to FIG. 1. As shown in FIG. 20, the high-concentration p-type layer 18, the n-type emitter layer 17, a polysilicon film 16, the n-type base layer 1, the low-concentration n-type buffer layer 11, the high-concentration n-type buffer layer 12 and the p-type collector layer 19 have elliptic plane shapes respectively, so that the n-type emitter layer 17 is formed inside the high-concentration p-type layer 18, and the polysilicon film 16, the n-type base layer 1, the low-concentration n-type buffer layer 11, the high-concentration n-type buffer layer 12 and the p-type collector layer 19 are successively formed inside the n-type emitter layer 17 in a similar manner to the above. The polysilicon film 16 is necessarily formed on the p-type base layer 13 (not shown in FIG. 20).

A gate insulating film 15 is formed on a part of the n-type emitter layer 17, a surface of the p-type base layer 13 and a part of the n-type base layer 1, while a polysilicon film 16 serving as a gate electrode part is formed on the gate insulating film 15. Further, an emitter electrode 20 is formed on the n-type emitter layer 17 and the high-concentration p-type layer 18, a gate electrode 21 is formed on the polysilicon film 16, and a collector electrode 22 is formed on the p-type collector layer 19. Numeral 14 denotes a field oxide film.

<Fabrication Method>

Figure 2:
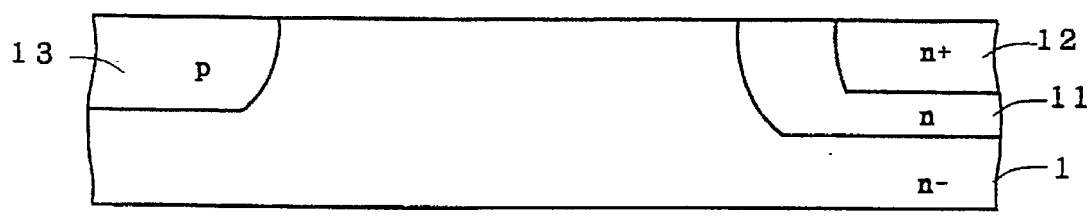
FIG. 2 is a sectional view showing a method of fabricating the lateral IGBT according to the first embodiment.
Figure 3:
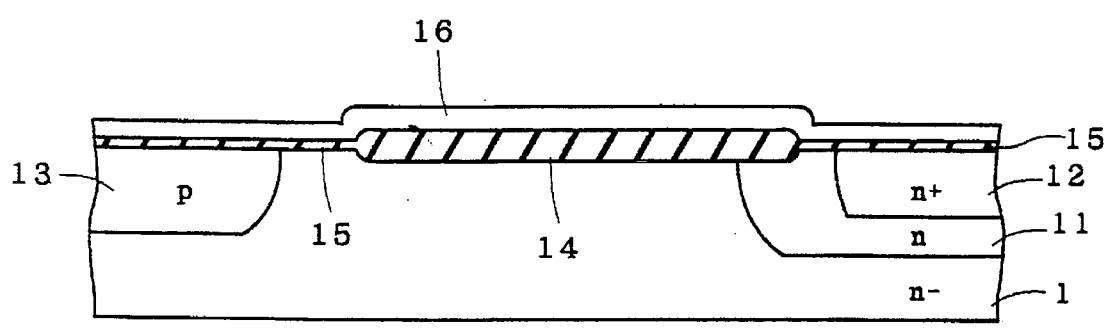
FIG. 3 is a sectional view showing the method of fabricating the lateral IGBT according to the first embodiment.
Figure 4:
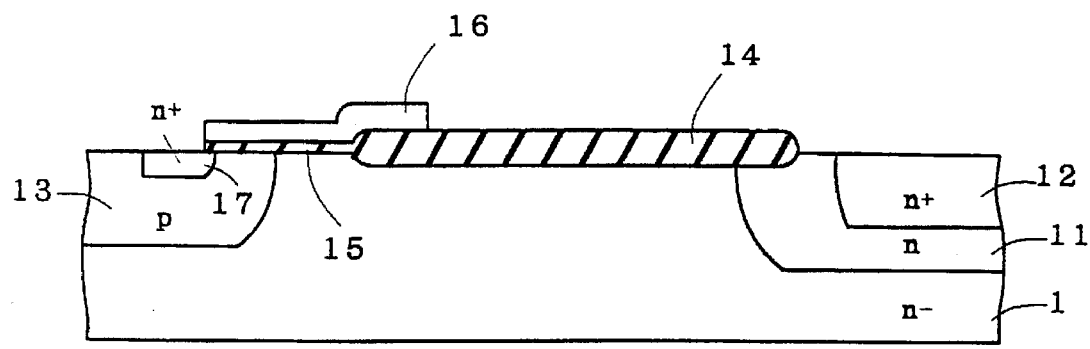
FIG. 4 is a sectional view showing the method of fabricating the lateral IGBT according to the first embodiment.

FIGS. 2 to 4 are sectional views showing a method of fabricating the lateral IGBT according to the first embodiment. The method of fabricating the IGBT according to the first embodiment is now described with reference to FIGS. 2 to 4.

First, n-type impurity ions are selectively implanted (first impurity implantation) into the high-resistance n-type base layer 1 at an injection rate of $1 \times 10^{23}$ cm$^{-2}$, for example, and diffused to form the low-concentration n-type buffer layer 11, as shown in FIG. 2. Then, n-type impurity ions are selectively implanted (second impurity implantation) into the low-concentration n-type buffer layer 11 and diffused, to form the high-concentration n-type buffer layer 12. Therefore, the high-concentration n-type buffer layer 12 is formed by double diffusion. The impurity concentrations of the low-concentration n-type buffer layer 11 and the high-concentration n-type buffer layer 12 satisfy conditional expressions 1 and 2 described later. Further, a p-type impurity is selectively implanted into the upper layer part of the high-resistance n-type base layer 1 independently of the low-concentration n-type buffer layer 11 and diffused, to form the p-type base layer 13.

Then, the field oxide film 14 is formed by a LOCOS method as shown in FIG. 3, and thereafter the gate insulating film 15 is formed so that the polysilicon film 16 is formed on the field oxide film 14 and the gate insulating film 15.

Then, the polysilicon film 16 is worked into the shape of a gate electrode part, as shown in FIG. 4. Then, the n-type emitter layer 17 is selectively formed on the surface of the p-type base layer 13 through resist, similarly to a general method of fabricating a low withstand voltage CMOS transistor. Then, the high-concentration p-type layer 18 is selectively formed on the surface of the p-type base layer 13 through resist to be adjacent to the n-type emitter layer 17, while the p-type collector layer 19 is selectively formed on the surface of the high-concentration n-type buffer layer 12. Then, an unnecessary portion of the oxide film is removed, the emitter electrode 20 is formed on parts of the n-type emitter layer 17 and the high-concentration p-type layer 18 respectively, the gate electrode 21 is formed on the polysilicon film 16, and the collector electrode 22 is formed on the p-type collector layer 19, thereby completing the structure of the lateral IGBT shown in FIG. 1.

Figure 5:
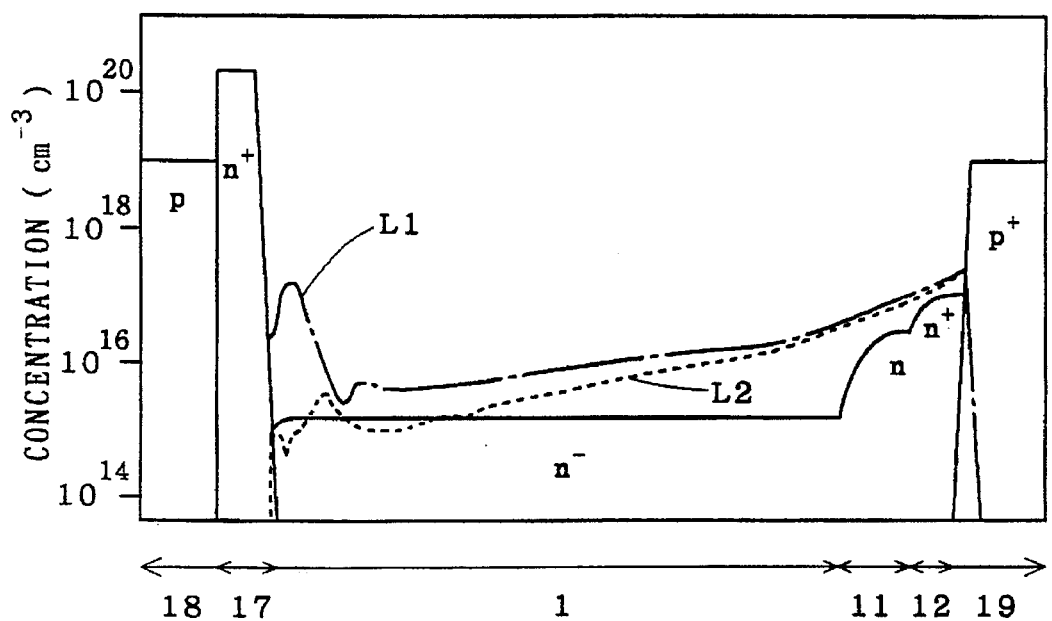
FIG. 5 is a diagram showing impurity concentration distribution of the lateral IGBT according to the first embodiment.

FIG. 5 is a graph showing impurity concentration distribution and carrier concentration distribution in an ON state in the lateral IGBT according to the first embodiment. Referring to this graph, lines L1 and L2 show concentrations of electrons and holes respectively, while the emitter electrode 20, the gate electrode 21 and the collector electrode 22 are set at the ground level, 5 V and 5 V in an ON time respectively.

In the lateral high withstand voltage IGBT according to the first embodiment, an n-type buffer layer is divided into two stage concentrations by the low-concentration n-type buffer layer 11 and the high-concentration n-type buffer layer 12, whereby the concentrations of the carriers (electrons and holes) are attenuated from the p-type collector layer 19 toward the high-resistance n-type base layer 1, as shown in FIG. 5.

Therefore, the impurity concentrations of the low-concentration n-type buffer layer 11 and the high-concentration n-type buffer layer 12 are so set that the concentrations of the carriers propagated through the n-type buffer layers 11 and 12 respectively are in excess of the impurity concentrations thereof.

Consequently, it is possible to prevent increase of an ON-state voltage by attenuating the concentrations of the n-type buffer layers 11 and 12 in two stages between the p-type collector layer 19 and the high-resistance n-type base layer 1. Further, turn-off ability is also improved since carrier lives are in inverse proportion to the impurity concentrations in a turn-off time.

However, the concentrations of the n-type buffer layers 12 and 13 must be set in a range capable of maintaining the withstand voltage. Therefore, it is preferable to set the concentration of the n-type buffer layer 11 at the maximum in a range below the carrier concentration in the ON time.

While a buffer region is formed by the low-concentration n-type buffer layer 11 and the high-concentration n-type buffer layer 12 having different impurity concentrations according to the first embodiment, the buffer region may alternatively be formed by three or more buffer layers.

Namely, the buffer region may be formed by first to n-th ($n \geq 2$) buffer layers over the n-type base layer 1 and the p-type collector layer 19. According to the first embodiment, n=2 and first and second buffer layers correspond to the low-concentration n-type buffer layer 11 and the high-concentration n-type buffer layer 12 respectively.

Assuming that B1 to Bn represent impurity concentrations of the first to n-th buffer layers respectively, and C1 to Cn represent concentrations of carriers which are propagated through the first to n-th buffer layers respectively in an ON state, conditional expression 1: $B1 < B2 < \ldots < Bn$ and conditional expression 2: $Bi < Ci$ ($1 \leq i \leq n$) may be satisfied.

In order to attain excellent withstand voltage and turn-off characteristics, it is preferable to maximize the respective impurity concentrations Bi in a range satisfying the aforementioned conditional expressions 1 and 2.

<<Concentration of n-Type Buffer Layer>>

Table 1 shows the relation between the element withstand voltage, the ON-state voltage and the turn-off time in the lateral IGBT according to the first embodiment.

Referring to Table 1, tSOI denotes the thickness of an n-type active layer 33 and tox denotes the thickness of an oxide film 31, while HVMOS denotes a high withstand voltage n-type MOS transistor having such a structure that the p-type collector layer 19 is replaced by an n-type high-concentration region, and Id denotes its drain current, Vg denotes its gate voltage, Vd denotes its drain voltage, and BVds denotes its drain-to-source withstand voltage. Further, VC denotes the collector voltage of an n-type IGBT corresponding to the lateral IGBT according to the first embodiment, BVces denotes a collector-to-emitter withstand voltage, tf denotes a turn-off time, and IC denotes a collector current.

The impurity concentration of the low-concentration n-type buffer layer 11 is decided by the first phosphorus implanation dose in a first impurity implantation step, while that of the high-concentration n-type buffer layer 12 is decided by the sum of first and second phosphorus implanation doses in first and second impurity implantation steps. In view of improvement of the withstand voltage in the lateral IGBT, the first phosphorus implanation dose must be at least $1 \times 10^{13}$ cm$^{-2}$ in order to attain a withstand voltage comparing with that of a high withstand voltage HVMOS, while the collector current IC of the IGBT is disadvantageously reduced from 182 to 17.5 mA by one digit to increase the ON-state voltage if the first phosphorus implanation dose is set at $2 \times 10^{14}$ cm$^{-2}$. As to the implanation doses capable of maintaining a high withstand voltage and reducing the ON-state voltage, therefore, the ideal first phosphorus implanation dose is about $1 \times 10^{13}$ cm$^{-2}$ when the second phosphorus implanation dose is $4.5 \times 10^{12}$ cm$^{-2}$. Also as to the turn-off time tf, it is possible to attain 590 ns of the allowable range.

Namely, the ideal first and second ion implantation doses are $1.0 \times 10^{13}$ cm$^{-2}$ and $4.5 \times 10^{12}$ cm$^{-2}$ respectively in the IGBT having the structure of the first embodiment from Table 1.

Table 2 shows the relation between phosphorus implanation doses and peak values of the impurity concentration of the n-type buffer layer. In this case, the ion implantation energy is 80 keV, and the depth of implantation is 0.1 μm.

TABLE 2

| Phosphorus Injection Rate (cm$^{-2}$) | yi (μm) | Peak Concentration of n-Type Buffer Layer (cm$^{-3}$) |
|---|---|---|
| $4.5 \times 10^{12}$ | 1.5 | $3.4 \times 10^{16}$ |
| $1 \times 10^{13}$ | 1.8 | $8.2 \times 10^{16}$ |
| $1 \times 10^{14}$ | 2.6 | $8.0 \times 10^{17}$ |
| $1 \times 10^{15}$ | 3.5 | $7.8 \times 10^{18}$ |
| $1 \times 10^{16}$ | 4.8 | $5.2 \times 10^{19}$ |

Referring to Table 2, yi denotes depths where the impurity concentrations reach $1 \times 10^{16}$ cm$^{-3}$. The relation with respect to the concentration distribution of the n-type buffer layer

TABLE 1

Figure 14:
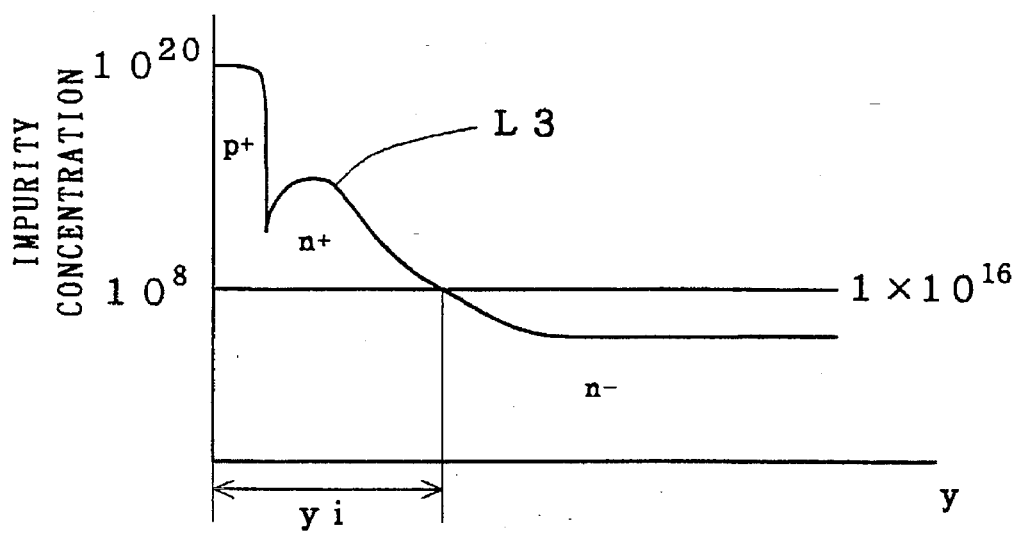
FIG. 14 is a graph showing the relation between a distance of implantation of an impurity and concentration distribution of an n-type buffer layer.

| Specification of SOI Substrate | | Second Phosphorous | First Phosphorous | nch-HVMOS | | nch-IGBT | | tf (ns) |
|---|---|---|---|---|---|---|---|---|
| tSOI (um) | tox (um) | Injection Rate (E12) | Injection Rate (E13) | Id (mA) Vg = Vd = 5 V | BVds (V) | Ic (mA) Vg = Vc = 5 V | BVces (V) | Vc = 50 V Ic = 10 mA |
| 10.0 | 2.0 | 4.5 | 0.0 | 6.5 | 363 | 185 | 100 | Unmeasured |
|  |  |  | 1.0 | 7.8 | 309 | 182 | 284 | 590 |
|  |  |  | 20.0 | 8.1 | 274 | 17.5 | 274 | 390 | after ion implantation and heat treatment is as shown in a characteristic curve L3 of FIG. 14. Referring to FIG. 14, y shows depths from the surface of the n-type base layer 1.

From Table 2, the peak concentration in case of ion implantation at $4.5 \times 10^{12}$ cm$^{-2}$ corresponding to the ideal second phosphorus implanation dose is $3.4 \times 10^{16}$ cm$^{-3}$, and that in case of ion implantation at $1 \times 10^{13}$ cm$^{-2}$ corresponding to the ideal first phosphorus implanation dose is $8.2 \times 10^{16}$ cm$^{-3}$.

In the structure of the IGBT according to the first embodiment, therefore, all of the withstand voltage, the ON-state voltage and the turn-off time can be satisfied when the impurity peak concentration of the low-concentration n-type buffer layer 11 is $8.2 \times 10^{16}$ cm$^{-3}$ and that of the high-concentration n-type buffer layer 12 is $11.6 \times 10^{16}$ cm$^{-3}$.

Further, it is inferred from Table 1 that the limit of the first phosphorus implanation dose is about $1.0 \times 10^{14}$ cm$^{-2}$ in order to maintain the turn-off time and the ON-state voltage, whereby the range of phosphorus implanation doses by the first and second phosphorus implantation operations is about $4.5 \times 10^{13}$ to $1.0 \times 10^{14}$ cm$^{-2}$. Therefore, it is conceivable that an impurity concentration setting range for the n-type buffer layers in an actual level is conceivably about $3.4 \times 10^{16}$ to $8.0 \times 10^{17}$ cm$^{-3}$ from Table 2.

<<Second Embodiment>>

<Structure>

Figure 6:
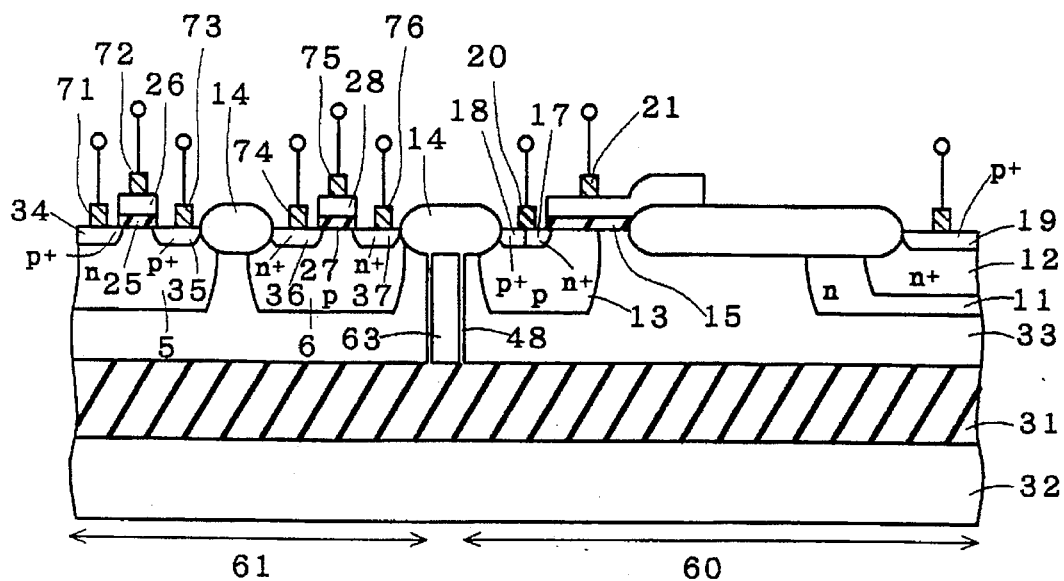
FIG. 6 is a sectional view showing the structure of a semiconductor device according to a second embodiment of the present invention.

FIG. 6 is a sectional view showing a semiconductor device according to a second embodiment, in which the high withstand voltage lateral IGBT according to the first embodiment shown in FIG. 1 and a low withstand voltage CMOS element are formed on the same dielectric isolated substrate. The substrate or a wafer has a support layer 32 and an n-type active layer 33 which are insulated from each other by an oxide film 31. A substrate of this type can be obtained by a cladding SOI method or an SIMOX method.

An oxide film 48 and a polysilicon buried layer 63 are arranged in the n-type active layer 33 through a surface and a back surface thereof, in order to dielectric-isolate a formation region 60 for the high withstand voltage lateral IGBT from a formation region 61 for another high withstand voltage element or a low withstand voltage element. An isolation structure by a trench or a V groove can be employed as the dielectric isolation structure.

The lateral IGBT which is formed in the formation region 60 has the same structure as the lateral IGBT according to the first embodiment shown in FIG. 1, as hereafter described. A p-type base layer 13 is selectively formed in an upper layer part of the n-type active layer 33, an n-type emitter layer 17 and a high-concentration p-type layer 18 are formed on a surface of the p-type base layer 13 to be adjacent to each other, a low-concentration n-type buffer layer 11 is formed in an upper layer part of an n-type base layer 1 independently of the p-type base layer 13, a high-concentration n-type buffer layer 12 is selectively formed in an upper layer part of the low-concentration n-type buffer layer 11, and a p-type collector layer 19 is selectively formed on a surface of the high-concentration n-type buffer layer 12. A gate insulating film 15 is formed on a part of the n-type emitter layer 17, a surface of the p-type base layer 13 and a part of the n-type base layer 1, while a polysilicon film 16 serving as a gate electrode part is formed on the gate insulating film 15. Further, an emitter electrode 20 is formed on the n-type emitter layer 17 and the high-concentration p-type layer 18, a gate electrode 21 is formed on the polysilicon film 16, and a collector electrode 22 is formed on the p-type collector layer 19. Numeral 14 denotes a field oxide film. Impurity concentrations of the low-concentration n-type buffer layer 11 and the high-concentration n-type buffer layer 12 satisfy the conditional expressions 1 and 2 described with reference to the first embodiment.

The low withstand voltage CMOS element which is formed in the formation region 61 has the following structure: An n-type well layer 5 and a p-type well layer 6 are selectively formed in the n-type active layer 33. A gate insulating film 25 and a polysilicon film 26 serving as a gate electrode part are selectively formed on a surface of the n-type well layer 5, while a gate insulating film 27 and a polysilicon film 28 serving as a gate electrode part are selectively formed on a surface of the p-type well layer 6. P-type diffusion layers 34 and 35 having relatively high impurity concentrations are formed on the surface of the n-type well layer 5 on both sides of the polysilicon film 26 to serve as a source and a drain respectively, while n-type diffusion layers 36 and 37 having relatively high impurity concentrations are formed on a surface of the p-type well layer 6. A source electrode 71, a gate electrode 72 and a drain electrode 73 are formed on the p-type diffusion layer 34, the polysilicon film 26 and the p-type diffusion layer 35 respectively, while a source electrode 74, a gate electrode 75 and a drain electrode 76 are formed on the n-type diffusion layer 36, the polysilicon film 28 and the n-type diffusion layer 37 respectively.

At this time, the semiconductor device according to the second embodiment sets the impurity concentration of the n-type well layer 5 of the low withstand voltage PMOS transistor at a level which is set by only a second phosphorus implanation dose for formation of the high-concentration n-type buffer layer 12 of the high withstand voltage lateral IGBT.

In addition, the p-type base layer 13 of the high withstand voltage lateral IGBT and the p-type well layer 6 of the low withstand CMOS element are set at the same impurity concentrations.

As hereinabove described, the lateral IGBT of the semiconductor device according to the second embodiment presents the same structure as that of the first embodiment including setting of the impurity concentrations of the low-concentration n-type buffer layer 11 and the high-concentration n-type buffer layer 12, whereby excellent ON-state voltage, withstand voltage and turn-off characteristics can be attained similarly to the first embodiment.

<Fabrication Method>

FIGS. 7 to 13 are sectional views showing a method of fabricating the semiconductor device according to the second embodiment. The method of fabricating the semiconductor device according to the second embodiment is now described with reference to FIGS. 7 to 13.

Figure 7:
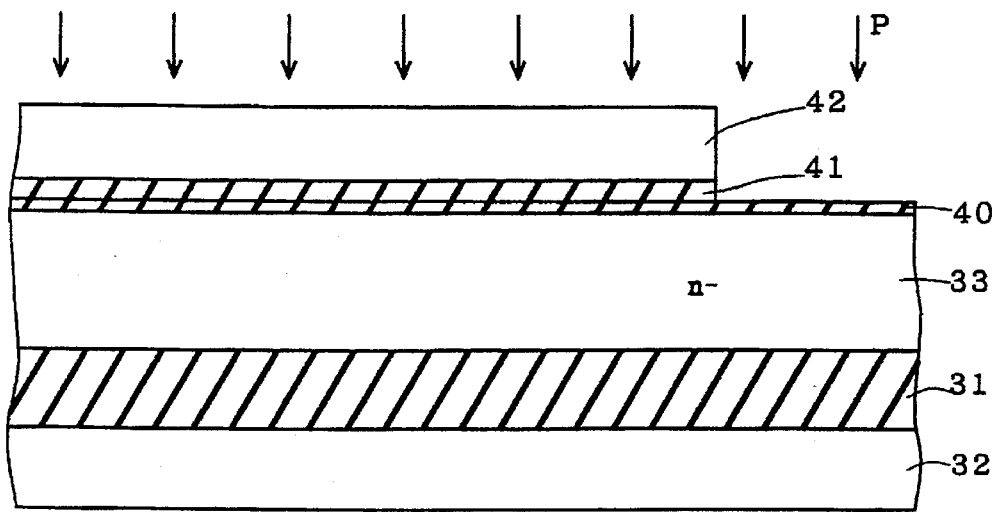
FIG. 7 is a sectional view showing a method of fabricating the semiconductor device according to the second embodiment.

First, a surface of the n-type active layer 33 of a cladding SOI substrate consisting of the support layer 32, the oxide film 31 and the n-type active layer 33 is oxidized to form an oxide film 40, a nitride film 41 is deposited on the oxide film 40, and a resist layer 42 is formed on the nitride film 41 and patterned, as shown in FIG. 7. The patterned resist layer 42 is employed as a mask to remove the nitride film 41 from regions for forming the n-type buffer layers 11 and 12, and thereafter phosphorus is implanted at an implanation dose of $3\times10^{13}$ cm$^{-2}$ (first phosphorus implanation dose).

Figure 8:
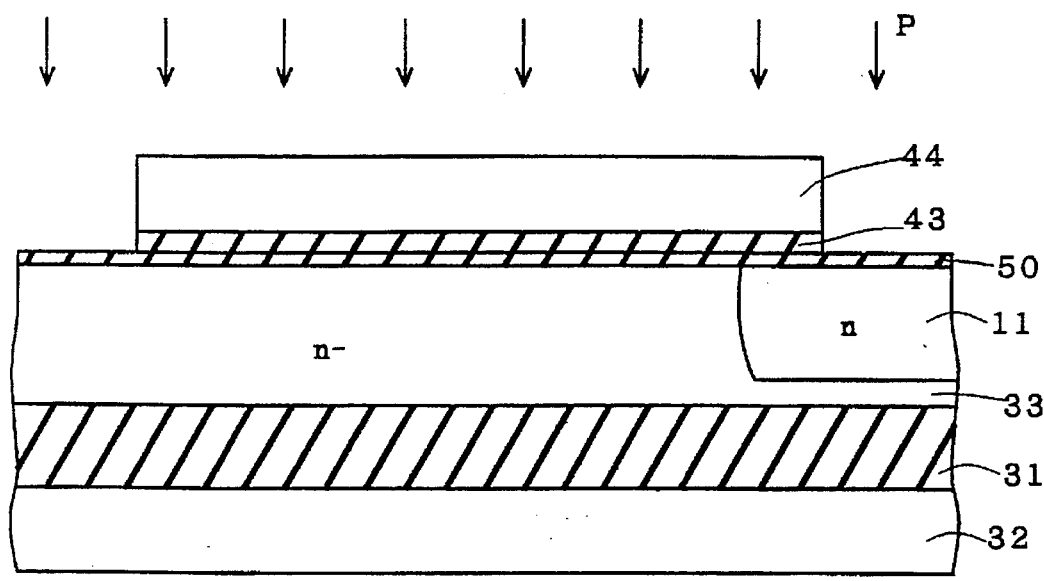
FIG. 8 is a sectional view showing the method of fabricating the semiconductor device according to the second embodiment.

As shown in FIG. 8, the resist layer 42 is removed, heat treatment is performed at 1200° C. for forming the low-concentration n-type buffer layer 11, thereafter the nitride film 41 and the oxide film 40 are removed, surfaces of the n-type active layer 33 and the low-concentration n-type buffer layer 11 of the SOI substrate are again oxidized to form an oxide film 56, a nitride film 43 is deposited on the oxide film 56, and a resist layer 44 is formed on the nitride film 43 and patterned. The patterned resist layer 44 is employed as a mask to remove a part for forming the high-concentration n-type buffer layer 12 inside the low-concentration n-type buffer layer 11 and a part of the nitride film 43 for forming an n-type well of a PMOS transistor of a CMOS element, and phosphorus is implanted at an implanation dose of $4.5\times10^{12}$ cm$^{-2}$ (second phosphorus implanation dose).

Figure 9:
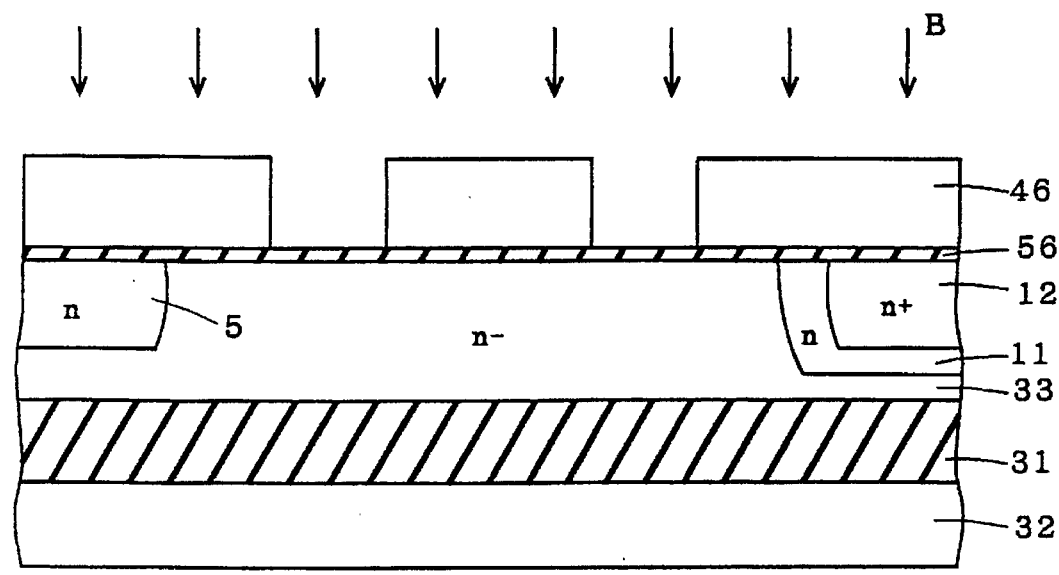
FIG. 9 is a sectional view showing the method of fabricating the semiconductor device according to the second embodiment.

Thereafter the resist layer 44 is removed, heat treatment is performed at 1100° C. to form the n-type well layer 5 and the high-concentration n-type buffer layer 12, and thereafter the nitride film 43 is removed, as shown in FIG. 9. Then, a resist layer 46 is formed on the oxide film 56, and patterned. Thereafter the resist layer 46 which is so patterned that a portion for forming a p-type well of an NMOS transistor of the CMOS element and a portion for forming a p-type base of the lateral IGBT are removed is employed as a mask to implant boron at $1\times10^{13}$ cm$^{-2}$.

Figure 10:
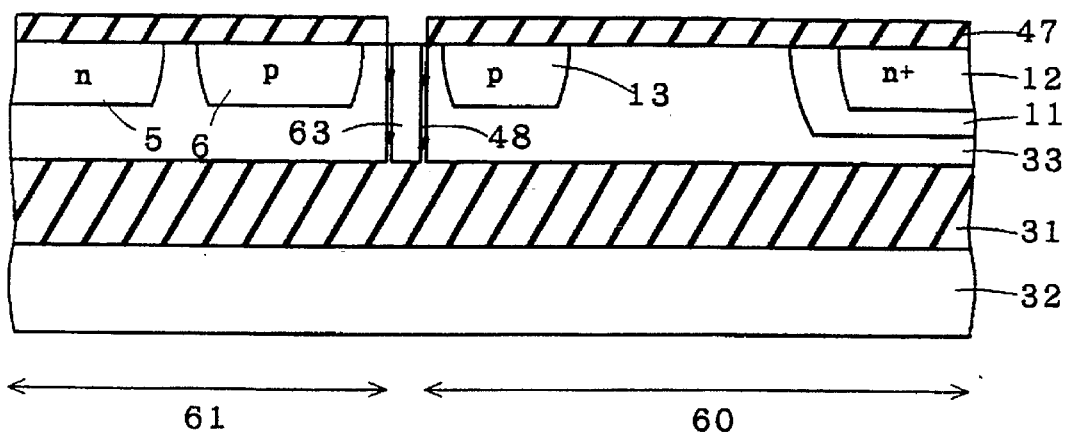
FIG. 10 is a sectional view showing the method of fabricating the semiconductor device according to the second embodiment.

Then, the resist layer 46 is removed, and thereafter heat treatment is performed at 1100° C. to form the p-type well layer 6 and the p-type base layer 13, as shown in FIG. 10. Then, an oxide film 47 is formed on the overall surface, and the oxide film 47 is patterned to remove only regions for forming the thermal oxide film 48 and the polysilicon buried layer 63 between the formation regions 60 and 61 for the lateral IGBT and the low withstand voltage CMOS element. The patterned oxide film 47 is employed as a mask to etch the n-type active layer 33, thereby forming a trench to reach the oxide film 31. Thereafter the oxide film 47 is removed and a side wall of the trench is thermally oxidized to form the thermal oxide film 48, thereafter polysilicon is deposited on the overall surface including the surface in the trench, and the polysilicon is etched back to be flush with the surface of the n-type active layer 33, for forming the polysilicon buried layer 63.

Figure 11:
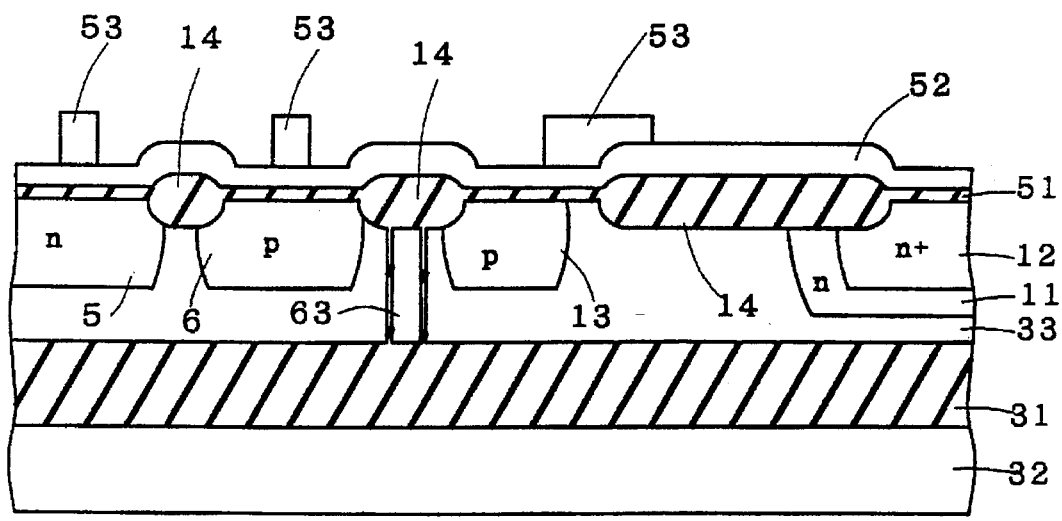
FIG. 11 is a sectional view showing the method of fabricating the semiconductor device according to the second embodiment.

As shown in FIG. 11, the field oxide film 14 is formed by a LOCOS method, to complete element isolation. Then, a gate oxide film 51 is formed, a polysilicon film 52 is deposited on the overall surface, and a resist layer 53 is formed on the polysilicon film 52. The resist layer 53 is patterned to leave only gate electrode parts of the respective devices. Thereafter the patterned resist layer 53 is employed as a mask to perform anisotropic etching on the polysilicon film 52, and the resist layer 53 is removed.

Figure 12:
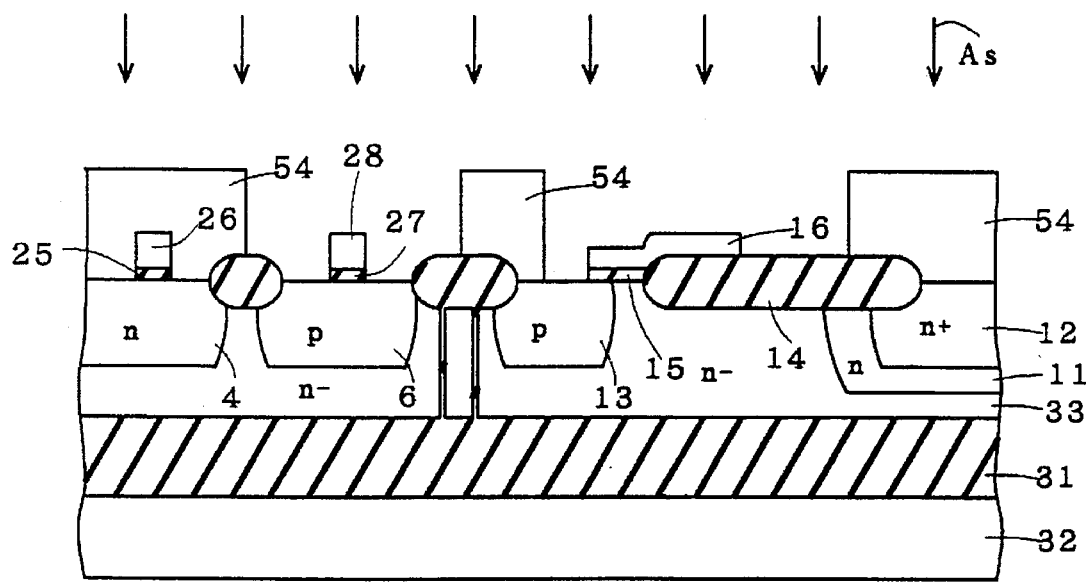
FIG. 12 is a sectional view showing the method of fabricating the semiconductor device according to the second embodiment.

Thus, the gate insulating film 15, the polysilicon film 16, the gate insulating film 25, the polysilicon film 26, the gate insulating film 27 and the polysilicon film 28 are formed as shown in FIG. 12. Thereafter a resist layer 54 is formed on the overall surface, and patterned to cover a PMOS part of the CMOS element and a p-type collector part and a p-type base lead part of the lateral IGBT. The patterned resist layer 54 is employed as a mask to implant arsenic at an implanation dose of $4 \times 10^{15}$ cm$^{-2}$, and thereafter the resist layer 54 is removed.

Figure 13:
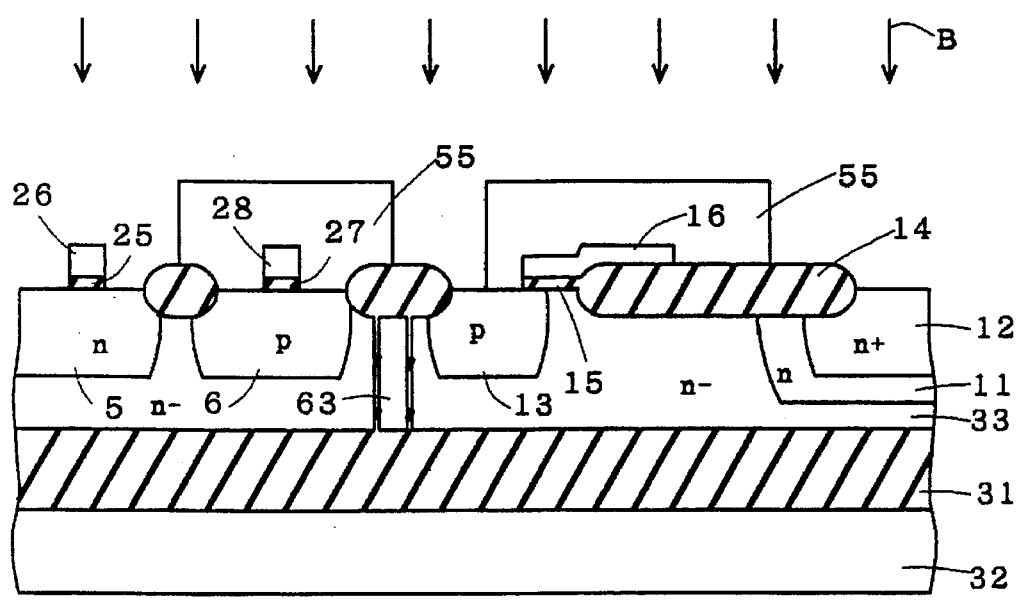
FIG. 13 is a sectional view showing the method of fabricating the semiconductor device according to the second embodiment.

Then, a resist layer 55 is formed on the overall surface and patterned to cover an NMOS part of the CMOS element and an n-type emitter part of the IGBT, as shown in FIG. 13. The patterned resist layer 55 is employed as a mask to implant boron at an implanation dose of $4 \times 10^{15}$ cm$^{-2}$, and thereafter the resist layer 55 is removed.

Then, heat treatment is performed to form the p-type diffusion layers 34 and 35, the n-type diffusion layers 36 and 37, the high-concentration p-type layer 18, the n-type emitter layer 17 and the n-type base layer 1, a source electrode 71, a gate electrode 72, a drain electrode 73, a source electrode 74, a gate electrode 75, a drain electrode 76, an emitter electrode 20, a gate electrode 21 and a collector electrode 22 are formed on the p-type diffusion layer 34, the polysilicon film 26, the p-type diffusion layer 35, the n-type diffusion layer 36, the polysilicon film 28, the n-type diffusion layer 37, parts of the n-type emitter layer 17 and the p-type layer 18, the polysilicon film 16, and the p-type collector layer 19 respectively through a passivation film, and the electrodes of the respective devices are taken out for completing the semiconductor device according to the second embodiment in which the lateral IGBT according to the first embodiment and the low withstand voltage CMOS element are formed on the same substrate.

In the semiconductor device according to the second embodiment, the n-type well layer 5 of the low withstand PMOS transistor is set at an impurity concentration which is set only by the second phosphorus implanation dose for formation of the high-concentration n-type buffer layer 12 of the high withstand voltage lateral IGBT while the p-type base layer 13 of the high withstand voltage lateral IGBT and the p-type well layer 6 of the low withstand voltage MOS are set at the same impurity concentrations, as hereinabove described.

Therefore, the impurity concentration of the n-type well layer 5 of the low withstand voltage PMOS transistor can be set by the second phosphorus implanation dose for formation of the high concentration n-type buffer layer 12 of the high withstand voltage lateral IGBT in fabrication of the semiconductor device according to the second embodiment, whereby the high-concentration n-type buffer layer 12 and the n-type well layer 5 can be formed in the same step.

In addition, the p-type base layer 13 of the high withstand voltage lateral IGBT and the p-type well layer 6 of the low withstand voltage CMOS element are formed at the same impurity implanation dose, whereby the p-type base layer 13 and the p-type well layer 6 can be formed in the same step.

Consequently, the high-concentration n-type buffer layer 12 and the n-type well layer 5 as well as the p-type base layer 13 and the p-type well layer 6 can be formed in the same steps respectively, whereby the fabrication steps can be shortened.

Further, the channel length can be shortened through a fine working technique which is practicable in ordinary low withstand CMOS element fabrication steps, whereby it is also possible to reduce the ON-state resistance of the high withstand voltage IGBT.

While the buffer region is formed by the low-concentration n-type buffer layer 11 and the high-concentration n-type buffer layer 12 of different impurity concentrations in the lateral IGBT of the semiconductor device according to the second embodiment, the buffer region may alternatively be formed by three or more buffer layers, similarly to the lateral IGBT according to the first embodiment.

Namely, the buffer region may be formed by first to n-th ($n \geq 2$) buffer layers over the n-type base layer 1 and the p-type collector layer 19, so that the respective buffer layers satisfy the conditional expressions 1 and 2 of the first embodiment.

The first to n-th buffer layers are formed by successively performing first to n-th impurity introducing processings for selectively introducing an n-type impurity. At this time, the impurity concentration of an i-th ($1 \leq i \leq n$) is set by the first to i-th impurity introducing processings. According to the second embodiment, n=2, and the first buffer layer, the second buffer layer, the first impurity introducing processing and the second impurity introducing processing correspond to the low-concentration n-type buffer layer 11, the high-concentration n-type buffer layer 12, implantation and diffusion of phosphorus ions at the first phosphorus implanation dose, and implantation and diffusion of phosphorus ions at the second phosphorus implanation dose respectively.

Assuming that SBk (k=2 to n)=Bk−B(k−1) and SB1=B1 in respective impurity concentrations B1 to Bn of the first to n-th buffer layers, impurity concentrations which are set by the first to n-th impurity introducing processings respectively are SB1 to SBn.

When the impurity concentration of the n-type well region 5 is set at any one of the values SB1 to SBn, therefore, this layer can be fabricated simultaneously with any one of the first to n-th impurity introducing processings, whereby the fabrication steps can be shortened.

<<Third Embodiment>>

Figure 15:
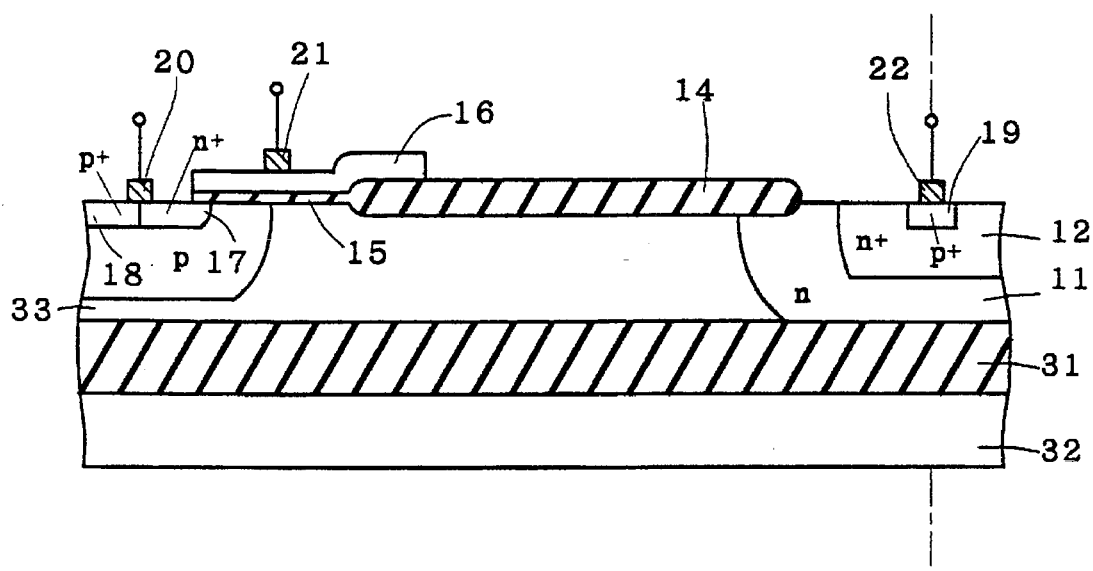
FIG. 15 is a sectional view showing the structure of a lateral IGBT according to a third embodiment of the present invention.

While the n-type buffer structure of the lateral IGBT according to the second embodiment has the n-type active layer 33 under the p-type collector layer 19, an effect which is basically similar to those of the lateral IGBTs according to the first and second embodiments can be attained also when a low-concentration n-type buffer 11 passes through a surface and a back surface of an n-type active layer 33 to be in contact with a buried oxide film 31 in a lateral IGBT according to a third embodiment of the present invention as shown in FIG. 15.

According to the structure of the lateral IGBT of the third embodiment, turn-off characteristics can be improved since the n-type active layer 33 can be formed in a smaller thickness as compared with that in the second embodiment.

While FIG. 15 is illustrated in correspondence to the IGBT of the semiconductor device according to the second embodiment, the low-concentration n-type buffer layer 11 passes through a surface and a back surface of an n-type base layer 1 when the third embodiment is rendered to correspond to the IGBT according to the first embodiment.

The lateral IGBT according to the third embodiment has an elliptic plane shape about the p-type collector layer 19, similarly to the plane shape of the first embodiment shown in FIG. 20.

<<Fourth Embodiment>>

Figure 16:
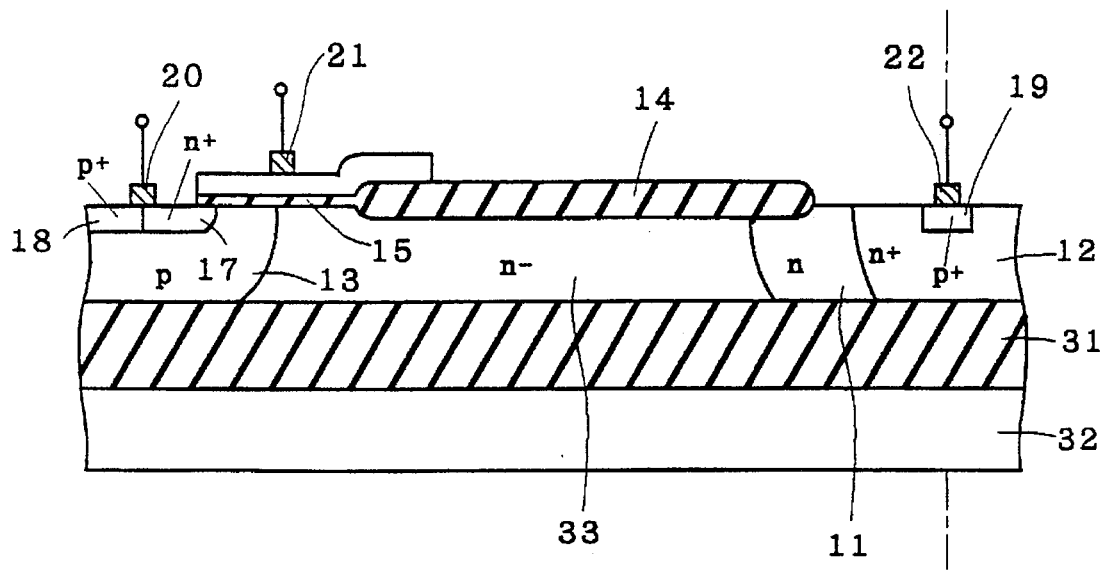
FIG. 16 is a sectional view showing the structure of a lateral IGBT according to fourth embodiment of the present invention.
Figure 17:
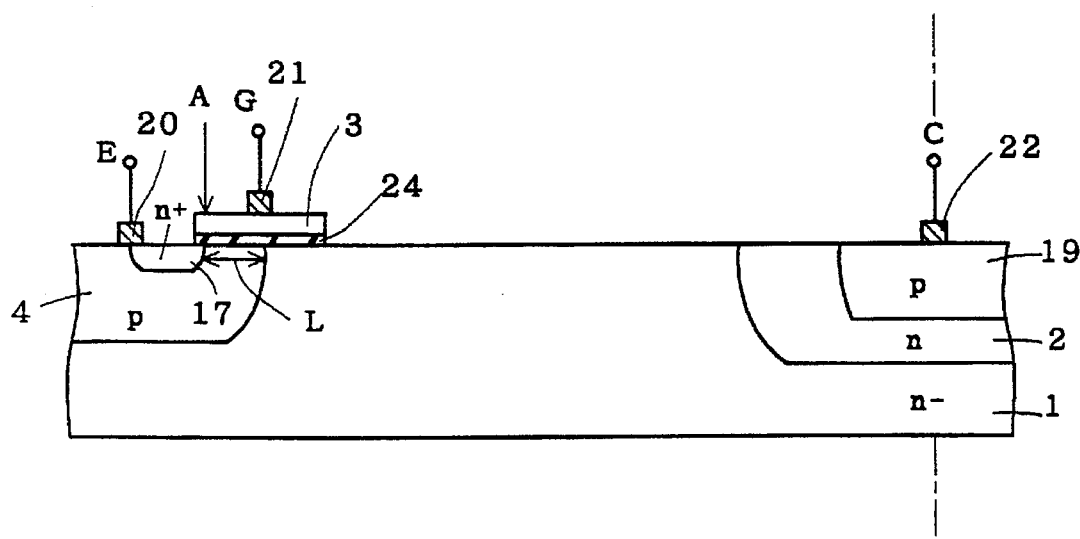
FIG. 17 is a sectional view showing the structure of a conventional lateral IGBT.
Figure 18:
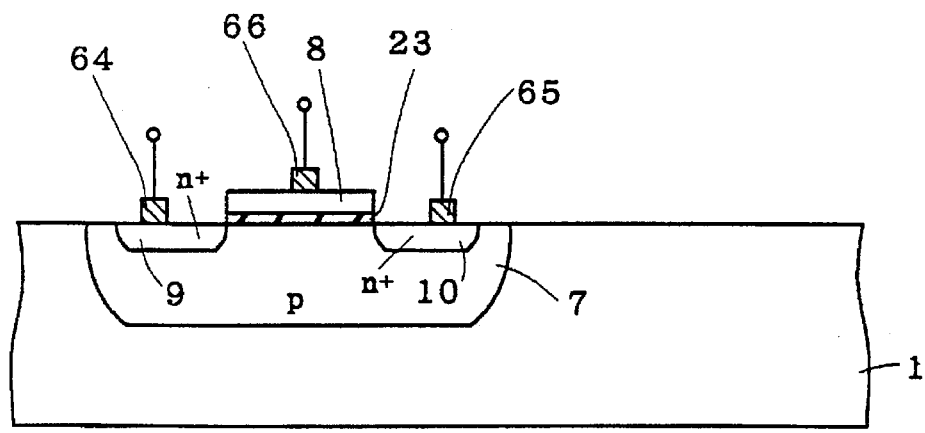
FIG. 18 is a sectional view showing the structure of a conventional NMOS transistor.
Figure 19:
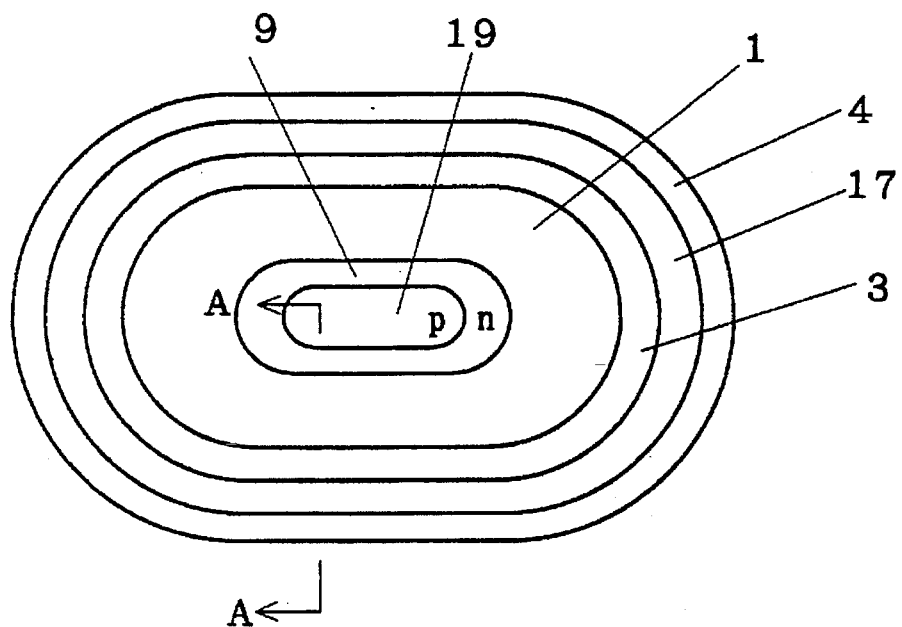
FIG. 19 is a plan view showing the plane structure of the conventional lateral IGBT.

Further, a similar effect can be expected also when a high-concentration n-type buffer layer 12 is also formed to pass through an n-type active layer 33 in addition to a low-concentration n-type buffer layer 11 while a portion immediately under a p-type collector layer 19 is formed only by the high-concentration n-type buffer layer 12, as shown in FIG. 16.

According to the structure of a lateral IGBT of a fourth embodiment, a turn-off time can be improved since the n-type active layer 33 can be formed in a smaller thickness as compared with that in the second embodiment, similarly to the lateral IGBT according to the third embodiment.

While FIG. 16 is illustrated in correspondence to the IGBT of the semiconductor device according to the second embodiment, the high-concentration n-type buffer layer 12 also passes through a surface and a back surface of an n-type base layer 1 in addition to the low-concentration n-type buffer layer 11 and the portion immediately under the p-type collector layer 19 is formed only by the high-concentration n-type buffer layer 12 when the fourth embodiment is rendered to correspond to the IGBT according to the first embodiment.

The lateral IGBT according to the fourth embodiment has an elliptic plane shape about the p-type collector layer 19, similarly to the plane shape of the first embodiment shown in FIG. 20.

<<Fifth Embodiment>>
<First Mode>
<Structure>

Figure 21:
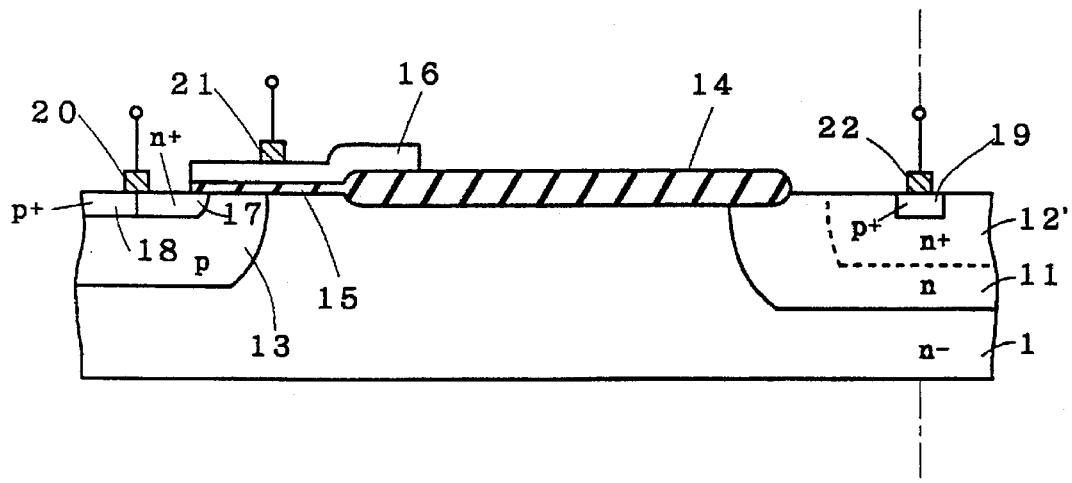
FIG. 21 is a sectional view showing the structure of a lateral IGBT according to a first mode of a fifth embodiment of the present invention.

FIG. 21 is a sectional view showing the sectional structure of a lateral IGBT according to a first mode of a fifth embodiment of the present invention. As shown in FIG. 21, a p-type base layer 13 is selectively formed in an upper layer part of a high-resistance n-type base layer 1, while an n-type emitter layer 17 and a high-concentration p-type layer 18 are formed on a surface of the p-type base layer 13 to be adjacent to each other, a low-concentration n-type buffer layer 11 is formed in the upper layer part of the n-type base layer 1 independently of the p-type base layer 13, high-concentration n-type buffer layers 12' are selectively discretely formed in the low-concentration n-type buffer layer 11, and a p-type collector layer 19 is selectively formed on surfaces of the low-concentration n-type buffer layer 11 and the high-concentration n-type buffer layers 12'. Namely, the high-concentration n-type buffer layers 12' and the low-concentration n-type buffer layer 11 are provided between the p-type collector layer 19 and the high-resistance n-type base layer 1 in a mixed manner, so that the low-concentration n-type buffer layer 11 and the high-concentration n-type buffer layers 12' are in connection with the p-type collector layer 19.

Figure 26:
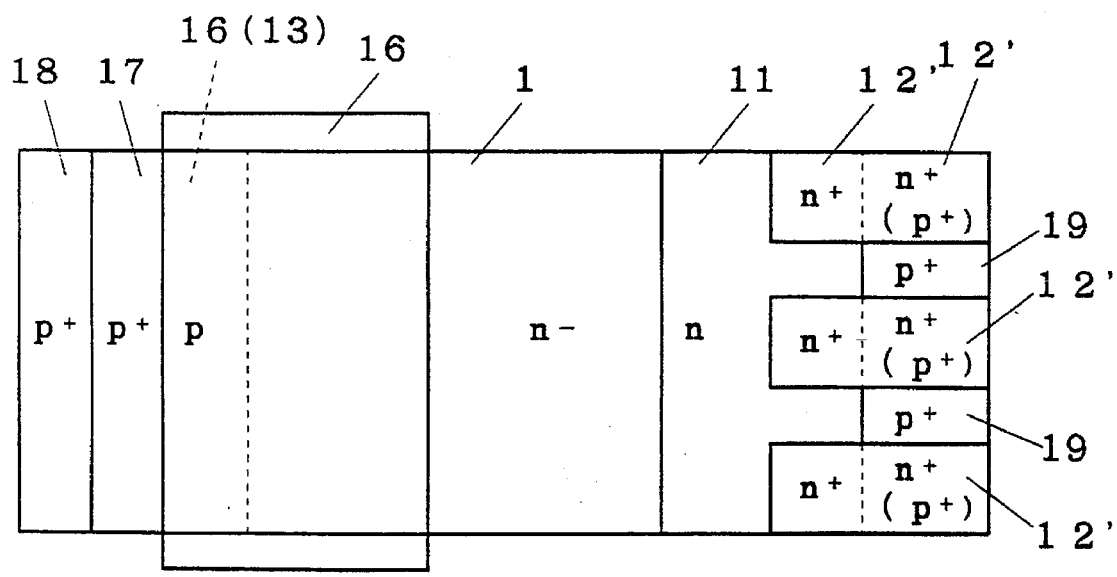
FIG. 26 is a plan view showing a part of FIG. 25 in detail.

FIG. 25 is a plan view showing the plane structure of the lateral IGBT according to the first mode of the fifth embodiment. FIG. 26 is a plan view showing a region A1 of FIG. 25 in an enlarged manner. A section taken along the line C—C in FIG. 25 corresponds to FIG. 21. As shown in FIG. 25, the high-concentration p-type layer 18, the n-type emitter layer 17, a polysilicon film 16, the p-type base layer 13, the low-concentration n-type buffer layer 11 and the p-type collector layer 19 have elliptic plane shapes respectively, so that the n-type emitter layer 17 is formed inside the high-concentration p-type layer 18, and the polysilicon film 16, the p-type base layer 13, the low-concentration n-type buffer layer 11 and the p-type collector layer 19 are successively formed inside the n-type emitter layer 17 in a similar manner to the above. The polysilicon film 16 is necessarily formed on the p-type base layer 13.

In the low-concentration n-type buffer layer 11, the high-concentration n-type buffer layers 12' having comb-type plane shapes (12A) and having cog-type plane shapes (12B) are formed longitudinal across a central portion and end circular portions of the p-type collector layer 19 respectively in a discrete manner.

On the other hand, a gate insulating film 15 is formed on a part of the n-type emitter layer 17, a surface of the p-type base layer 13 and a part of the n-type base layer 1, while the polysilicon film 16 is formed on the gate insulating film 15 to serve as a gate electrode part. An emitter electrode 20, a gate electrode 21 and a collector electrode 22 are formed on the n-type emitter layer 17 and the high-concentration p-type layer 18, the polysilicon film 16 and the p-type collector layer 19 respectively. Numeral 14 denotes a field oxide film.

<Fabrication Method>

Figure 22:
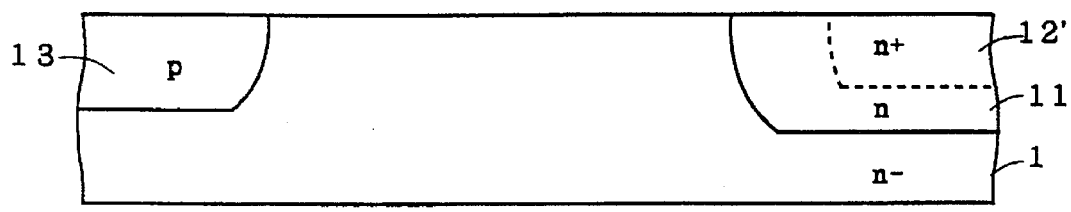
FIG. 22 is a sectional view showing a method of fabricating the lateral IGBT according to the first mode of the fifth embodiment.
Figure 23:
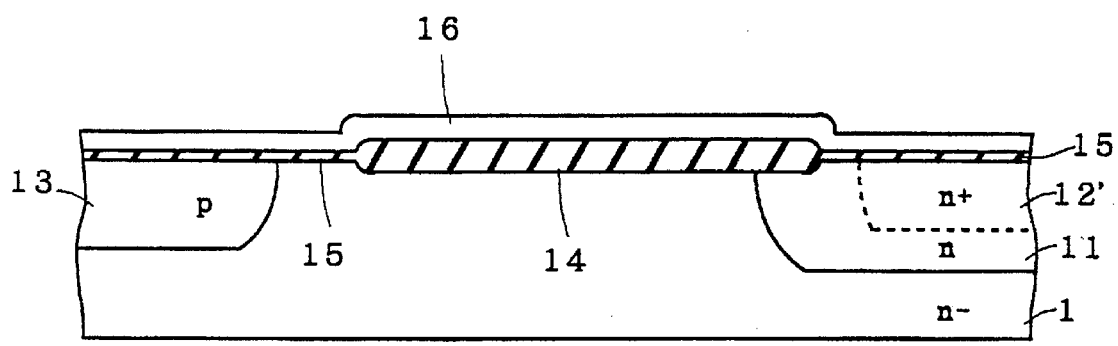
FIG. 23 is a sectional view showing the method of fabricating the lateral IGBT according to the first mode of the fifth embodiment.
Figure 24:
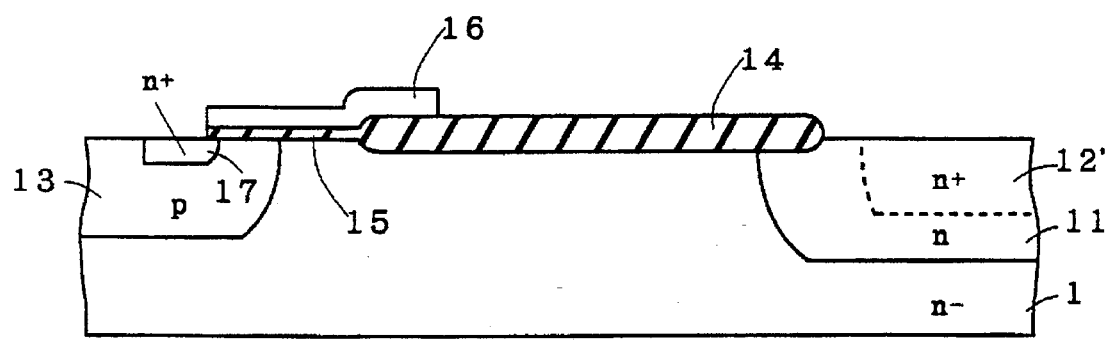
FIG. 24 is a sectional view showing the method of fabricating the lateral IGBT according to the first mode of the fifth embodiment.
Figure 27:
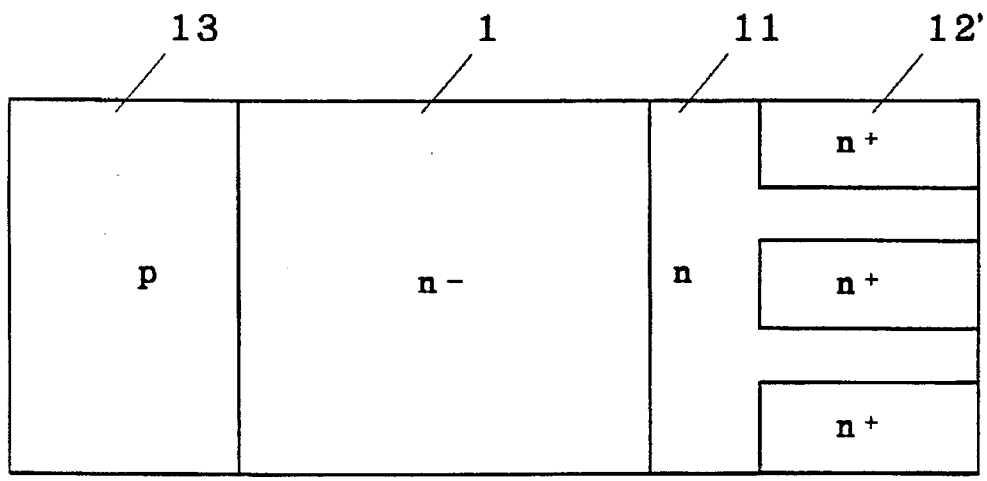
FIG. 27 is a plan view showing the method of fabricating the lateral IGBT according to the first mode of the fifth embodiment.

FIGS. 22 to 24 are sectional views showing a method of fabricating the lateral IGBT according to the first mode of the fifth embodiment. FIG. 27 is a plan view showing the plane structure of a portion corresponding to FIG. 26 during the fabrication steps. The method of fabricating the lateral IGBT according to the first mode of the fifth embodiment is now described with reference to FIGS. 22 to 24 and 27.

As shown in FIG. 22, n-type impurity ions are selectively implanted into the high-resistance n-type base layer 1 (first impurity implantation) at an injection rate of $1.4 \times 10^{13}$ cm$^{-2}$, for example, and diffused to form the low-concentration n-type buffer layer 11. Then, n-type impurity ions are selectively implanted into the low-concentration n-type buffer layer 11 (second impurity implantation), to discretely form the high-concentration n-type buffer layers 12', as shown in FIG. 27. Thus, the high-concentration n-type buffer layers 12' are formed by double diffusion. Further, a p-type impurity is selectively implanted into and diffused in the upper layer part of the high-resistance n-type base layer 1 independently of the low-concentration n-type buffer layer 11, to form the p-type base layer 13.

Then, the field oxide film 14 is formed by a LOCOS method, followed by formation of the gate insulating film 15, and the polysilicon film 16 is formed on the field oxide film 14 and the gate insulating film 15, as shown in FIG. 23.

Then, the polysilicon film 16 is worked into the form of a gate electrode part, as shown in FIG. 24. Then, the n-type emitter layer 17 is selectively formed on the surface of the p-type base layer 13 through resist, similarly to an ordinary method of fabricating a low withstand voltage CMOS transistor. Then, the high-concentration p-type layer 18 is selectively formed on the surface of the p-type base layer 13 through resist to be adjacent to the n-type emitter layer 17, while the p-type collector layer 19 is selectively formed on the surfaces of the low-concentration n-type buffer layer 11 and the high-concentration n-type buffer layers 12'. Unnecessary portions of the oxide film are removed, and the emitter electrode 20, the gate electrode 21 and the collector electrode 22 are formed on parts of the n-type emitter layer 17 and the high-concentration p-type layer 18, the polysilicon film 16 and the p-type collector layer 19 respectively, thereby completing the structure of the lateral IGBT shown in FIG. 21.

In the lateral IGBT according to the first mode of the fifth embodiment, a low-concentration part (the low-concentration n-type buffer layer 11) and high-concentration parts (the high-concentration n-type buffer layers 12') are formed in a mixed manner as n-type buffer layers, and a part of the low-concentration n-type buffer layer 11 and the p-type collector layer 19 are necessarily connected with each other, whereby electrons are directed toward the p-type collector layer 19 upon application of a positive voltage to the gate electrode 21, so that injection of holes is first started from the p-type collector layer 19 into the low-concentration n-type buffer layer 11 to facilitate electron injection from the emitter side. Thus, a synergistic effect acts to increase the carrier concentration.

While it is necessary to set the impurity concentrations of the high-concentration n-type buffer layers 12' below the carrier concentration in a stationary state in order to prevent increase of the ON-state voltage, the carrier concentration in the stationary state can be sufficiently highly set due to the presence of the part of the low-concentration n-type buffer layer 11 which is connected with the p-type collector layer 19, as described above.

Consequently, it is possible to improve the withstand voltage and the turn-off ability without increasing the ON-state voltage by sufficiently highly setting the impurity concentrations of the high-concentration n-type buffer layers 12'.

<Second Mode>

Figure 28:
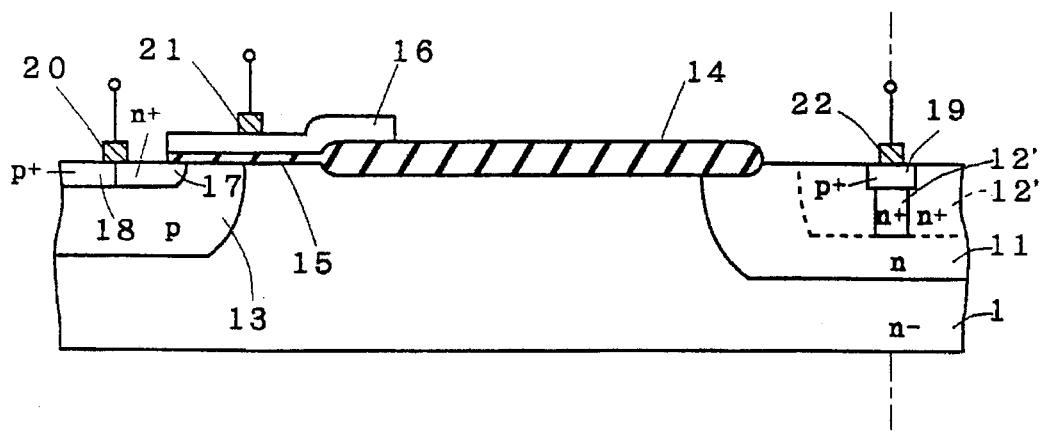
FIG. 28 is a sectional view showing the structure of a lateral IGBT according to the second mode of the fifth embodiment of the present invention.
Figure 29:
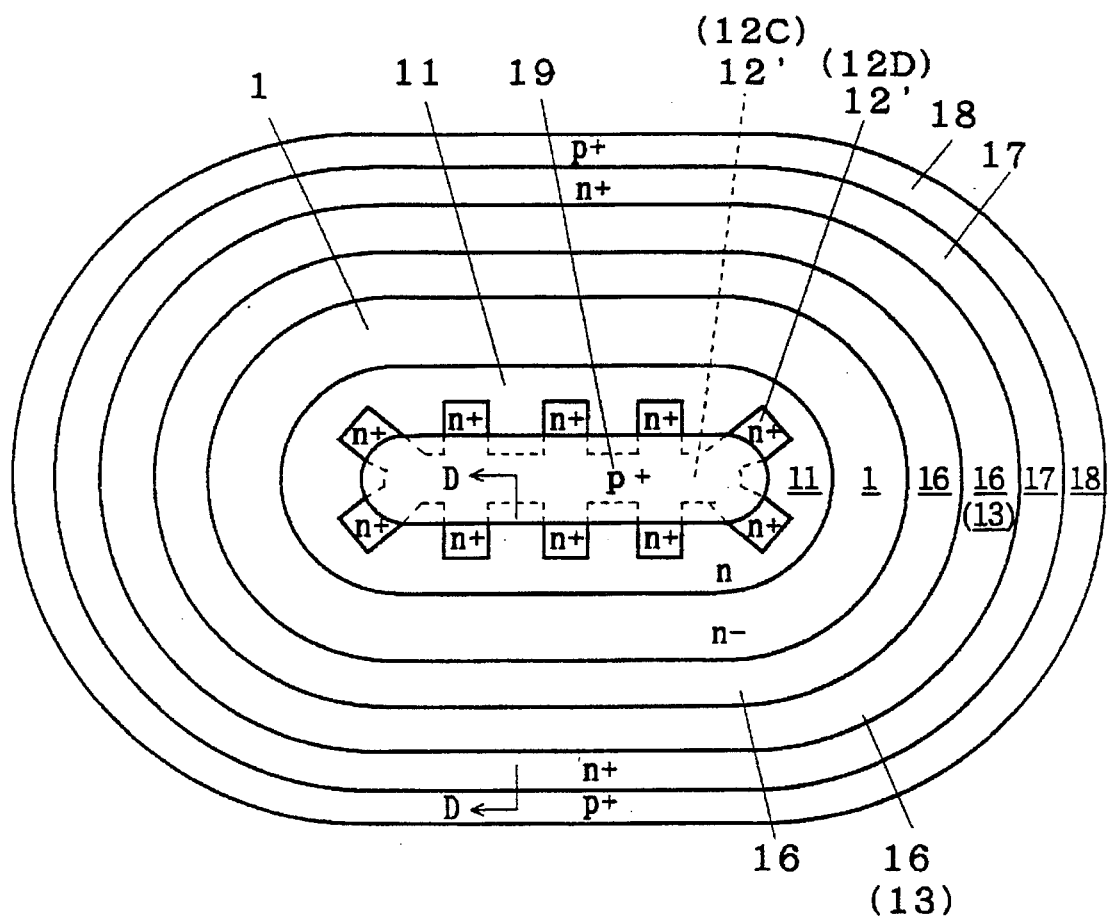
FIG. 29 is a plan view showing the plane structure of the lateral IGBT according to the second mode of the fifth embodiment.

FIGS. 28 and 29 are a sectional view and a plan view showing the sectional and plane structures of a lateral IGBT according to a second mode of the fifth embodiment of the present invention respectively. FIG. 28 shows a section taken along the line D—D in FIG. 29. As shown in FIG. 29, high-concentration n-type buffer layers 12' consist of central regions (12C) which are positioned on a central portion of a p-type collector layer 19 and end regions (12D) which are radially formed from the central regions 12C, and have plane shapes radially extending from portions under the central portion of the p-type collector layer 19. The remaining structure of this mode is similar to that of the first mode, and hence redundant description is omitted. A method of fabricating the lateral IGBT according to the second mode is similar to that for the first mode except setting of the plane shapes of the high-concentration n-type buffer layers 12'.

In the lateral IGBT according to the second mode of the fifth embodiment having the aforementioned structure, a part of a low-concentration n-type buffer layer 11 and the p-type collector layer 19 are necessarily electrically connected with each other similarly to the first mode, whereby the carrier concentration in a stationary state can be increased.

Consequently, impurity concentrations of the high-concentration n-type buffer layers 12' can be sufficiently highly set below the carrier concentration in the stationary state, whereby it is possible to improve the withstand voltage and the turn-off ability while preventing increase of the ON-state voltage.

In addition, the high-concentration n-type buffer layers 12' are necessarily present under the central portion of the p-type collector layer 19, whereby the high-concentration n-type buffer layers 12' suppress extension of a depletion layer extending from a lower portion toward the p-type collector layer 19, so that it is possible to reliably avoid the depletion layer from reaching the central portion of the p-type collector layer 19 and to maintain a higher withstand voltage as compared with the first mode.

<<Sixth Embodiment>>

Figure 30:
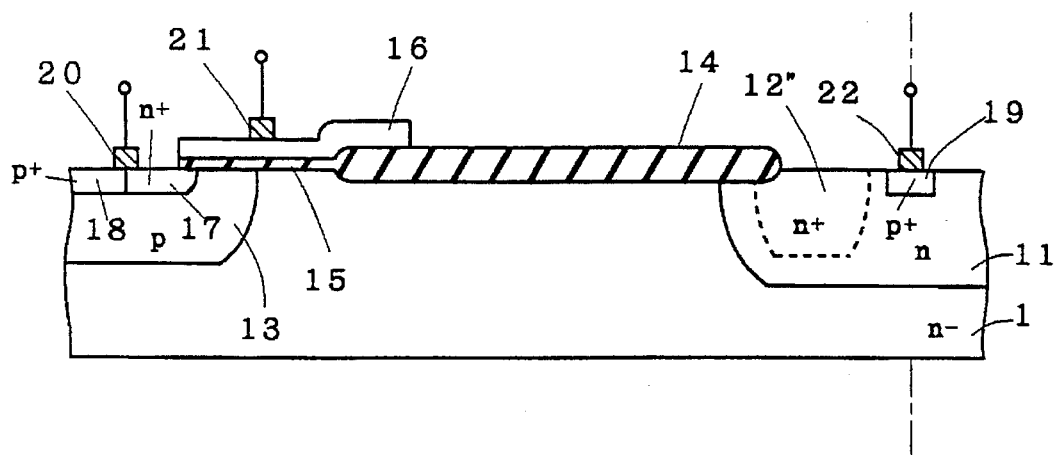
FIG. 30 is a plan view showing the plane structure of the lateral IGBT according to the sixth embodiment of the present invention.
Figure 31:
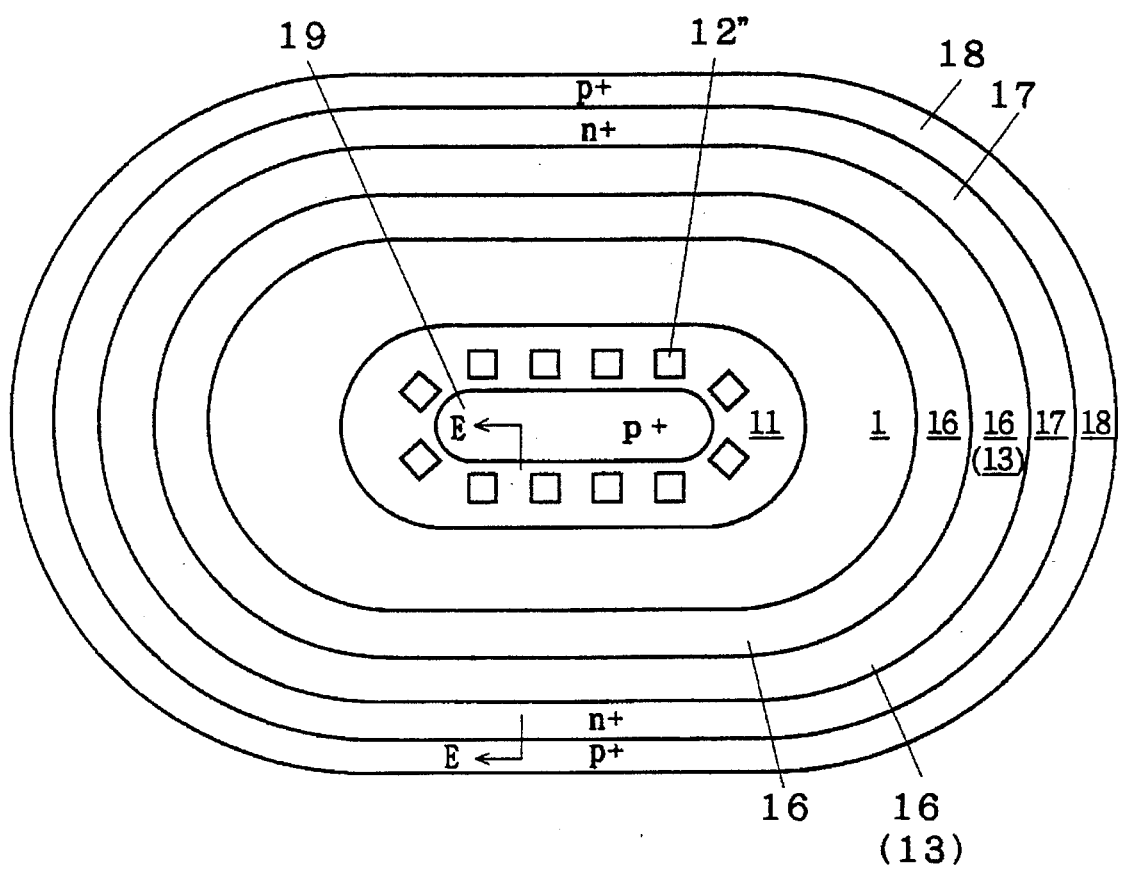
FIG. 31 is a plan view showing the plane structure of the lateral IGBT according to the sixth embodiment.

FIGS. 30 and 31 are a sectional view and a plan view showing the sectional and plane structures of a lateral IGBT according to a sixth embodiment of the present invention respectively. FIG. 30 shows a section taken along the line E—E in FIG. 31. As shown in these figures, high-concentration n-type buffer layers 12" are not connected with a p-type collector layer 19, but elliptically discretely formed to be separated from the outer periphery of the p-type collector layer 19 at prescribed distances in plane shape. The remaining structure is similar to that of the first mode of the fifth embodiment, and hence redundant description is omitted.

In the lateral IGBT according to the sixth embodiment having the aforementioned structure, a part of a low-concentration n-type buffer layer 11 and the p-type collector layer 19 are necessarily electrically connected with each other similarly to the first and second modes of the fifth embodiment, whereby the carrier concentration is increased.

Thus, it is possible to improve the withstand voltage and the turn-off ability without increasing the ON-state voltage, similarly to the fifth embodiment.

In particular, the p-type collector layer 19 is formed only on the surface of the low-concentration n-type buffer layer 11 to attain a wide connection region between the p-type collector layer 19 and the low-concentration n-type buffer layer 11, whereby the impurity concentrations of the high-concentration n-type buffer layers 12", which must be set below the carrier concentration in a stationary state in order to prevent increase of the ON-state voltage, can be set to be higher than those in the fifth embodiment.

While the invention has been shown and described in detail, the foregoing description is in all aspects illustrative and not restrictive. It is therefore understood that numerous modifications and variations can be devised without departing from the scope of the invention.

What is claimed is:

1. A transversal insulated gate bipolar transistor comprising:

a first conductivity type first semiconductor layer;

a second conductivity type second semiconductor layer selectively formed in an upper layer part of said first semiconductor layer;

a first conductivity type third semiconductor layer selectively formed on a surface of said second semiconductor layer;

an insulating film formed on said second semiconductor layer between said first and third semiconductor layers;

a control electrode part formed on said insulating film;

a first conductivity type fourth semiconductor layer selectively formed in said first semiconductor layer independently of said second semiconductor layer; and a second conductivity type fifth semiconductor layer selectively formed on a surface of said fourth semiconductor layer, wherein said fourth semiconductor layer comprises, a plurality (n) of first conductivity type buffer layers successively formed between said first and said fifth semiconductor layers, said fifth semiconductor layer formed on a surface of an n-th buffer layer, said plurality of buffer layers satisfying both of, conditional expression 1, $3.4 \times 10^{16}$ cm$^{-3}$≦B1<B2< . . . <Bn and conditional expression 2, B1<C1, ..., Bn<Cn where B1 to Bn represent first conductivity type impurity concentrations of a first to the n-th buffer layers respectively, and where C1 to Cn represent concentrations of carriers that propagate through said first to said n-th buffer layers when said insulated gate bipolar transistor is in an ON state defined by applying a prescribed voltage to said control electrode part and feeding a current across said third and said fifth semiconductor layers while setting a prescribed voltage potential difference therebetween.

2. The transversal insulated gate bipolar transistor in accordance with claim 1, wherein said plurality of buffer layers comprises two buffer layers, said impurity concentration B1 of said first buffer layer is $3.4 \times 10^{16}$ cm$^{-3}$, and said impurity concentration B2 of a second buffer layer is $1.16 \times 10^{17}$ cm$^{-3}$.

3. The transversal insulated gate bipolar transistor in accordance with claim 1, wherein said impurity concentrations B1 to the Bn of said first to n-th buffer layers are in the range of $3.4 \times 10^{16}$ to $8.0 \times 10^{17}$ cm$^{-3}$ respectively.

4. The transversal insulated gate bipolar transistor in accordance with claim 1, wherein said fourth semiconductor layer is formed to pass through a first surface and a back surface of said first semiconductor layer.

5. The transversal insulated gate bipolar transistor in accordance with claim 4, wherein said plurality of buffer layers comprises two buffer layers, and said fifth semiconductor layer is not supported by the first buffer layer.

6. A transversal insulated gate bipolar transistor comprising:
a first conductivity type first semiconductor layer;
a second conductivity type second semiconductor layer selectively formed in an upper layer part of said first semiconductor layer;
a first conductivity type third semiconductor layer selectively formed on a surface of said second semiconductor layer;
an insulating film formed on said second semiconductor layer between said first and third semiconductor layers;
a control electrode part formed on said insulating film;
a first conductivity type fourth semiconductor layer selectively formed in said first semiconductor layer independently of said second semiconductor layer, said fourth semiconductor layer comprising,
a first buffer of the first conductivity type, and
a second buffer layer of the first conductivity type layer having a higher impurity concentration than said first buffer layer, and selectively formed on the first buffer layer; and
a second conductivity type fifth semiconductor layer being selectively formed on a surface of said fourth semiconductor layer,
wherein said first buffer layer and second buffer layer of said fourth semiconductor layer being formed between said first and said fifth semiconductor layers, and
said fifth semiconductor layer being formed on a surface of said first buffer layer and a surface of said second buffer layer.

7. The transversal insulated gate bipolar transistor in accordance with claim 6, wherein said second buffer layer is discretely formed on said surface of said first buffer layer.

8. The transversal insulated gate bipolar transistor in accordance with claim 6, wherein said fifth semiconductor layer comprises a central portion supported by the second buffer layer.

9. A transversal insulated gate bipolar transistor comprising:
a first conductivity type first semiconductor layer;
a second conductivity type second semiconductor layer selectively formed in an upper layer part of said first semiconductor layer;
a first conductivity type third semiconductor layer selectively formed on a surface of said second semiconductor layer;
an insulating film formed on said second semiconductor layer between said first and third semiconductor layers;
a control electrode part formed on said insulating film;
a first conductivity type fourth semiconductor layer with a higher impurity concentration than the first semiconductor layer selectively formed in said first semiconductor layer independently of said second semiconductor layer, said fourth semiconductor layer comprising,
a first buffer of the first conductivity type, and
a second buffer layer of the first conductivity type layer having a higher impurity concentration than said first buffer layer, and selectively formed on the first buffer layer; and
a second conductivity type fifth semiconductor layer being selectively formed on a surface of said fourth semiconductor layer,
wherein said first buffer layer and second buffer layer of said fourth semiconductor layer being formed between said first and said fifth semiconductor layers, and
said fifth semiconductor layer being formed only on a surface of said first buffer layer and separated in a transversal direction from said second buffer layer by a prescribed distance.

10. The transversal insulated gate bipolar transistor in accordance with claim 9, wherein said second buffer layer is discretely formed on said surface of said first buffer layer.

11. A semiconductor device comprising:
a field effect transistor being formed in a first portion of a first semiconductor layer; and
an insulated gate bipolar gate transistor formed independently of the field effect transistor in a second portion of the first conductivity layer, comprising;
a second conductivity type second semiconductor layer selectively formed in an upper layer part of said first semiconductor layer,
a first conductivity type third semiconductor layer selectively formed on a surface of said second semiconductor layer,
an insulating film formed on said second semiconductor layer between said first and third semiconductor layers,
a control electrode part formed on said insulating film,
a first conductivity type fourth semiconductor layer selectively formed in said first semiconductor layer independently of said second semiconductor layer, and
a second conductivity type fifth semiconductor layer selectively formed on a surface of said fourth semiconductor layer,
wherein said fourth semiconductor layer comprises,
a plurality (n) of first conductivity type buffer layers successively formed between said first and said fifth semiconductor layers said fifth semiconductor layer being formed on a surface of an n-th buffer layer,
said plurality of buffer layers satisfying both of,
conditional expression 1, $3.4 \times 10^{16}$ cm$^{-3} \leq$ B1<B2< ... <Bn and conditional expression 2, B1<C1, ..., Bn<Cn, where B1 to Bn represent first conductivity type impurity concentrations of a first to the n-th buffer layers respectively, and where C1 to Cn represent concentrations of carriers that propagate through said first to said n-th buffer layers when said insulated gate bipolar transistor is in an ON state defined by applying a prescribed voltage to said control electrode part and feeding a current across said third and said fifth semiconductor layers while setting a prescribed voltage potential difference therebetween.

12. The semiconductor device in accordance with claim 11, wherein said field effect transistor comprises:

a second conductivity type well region formed in said upper layer part of said first portion of said first semiconductor layer;

a first conductivity type first diffusion region;

a first conductivity type second diffusion region, said first and said second diffusion region selectively formed on a surface of said well region;

a second insulating film formed on said well region between said first and said second diffusion regions; and a second control electrode part formed on said second insulating film, wherein said well region having a same impurity concentration as said second semiconductor layer.

13. The semiconductor device in accordance with claim 11, wherein said field effect transistor comprising:

a first conductivity type well region formed in said upper layer part of said first portion of said first semiconductor layer;

a second conductivity type first diffusion region;

a second conductivity type second diffusion region, said first and second diffusion regions being selectively formed on a surface of said well region;

a second insulating film formed on said well region between said first and said second diffusion regions; and a second control electrode part formed on said second insulating film, wherein, an impurity concentration of said well region set at any one of values SB1 to SBn, where SB1=B1, SB2=B2–B1, ..., SBn=Bn–$B_{n-1}$.

14. The semiconductor device in accordance with claim 11, wherein said field effect transistor includes first and second field effect transistors, wherein said first field effect transistor comprising:

a second conductivity type first well region formed in said upper layer part of said first portion of, said first semiconductor layer;

a first conductivity type first diffusion region;

a first conductive type second diffusion region, said first and second diffusion regions selectively formed on a surface of said well region;

a second insulating film being formed on said first well region between said first and said second diffusion regions; and a second control electrode part being formed on said second insulating film, said second field effect transistor comprising, said first semiconductor layer, a first conductivity type second well region being formed in said upper layer part of said first portion of said first semiconductor layer independently of said first well region, a second conductivity type third diffusion region, a second conductivity type fourth diffusion region, said third and fourth diffusion regions being selectively formed on a surface of said second well region;

a third insulating film being formed on said second well region between said third and fourth diffusion regions; and a third control electrode part being formed on said second insulating film, wherein said first well region having the same impurity concentration as said second semiconductor layer, an impurity concentration of said second well region being set at any one of values SB1 to SBn, where SB1=B1, SB2=B2–B1, ..., SBn=Bn–B(n–1).

* * * * *